United States Patent [19]
Sugasawara et al.

[11] Patent Number: 5,972,541
[45] Date of Patent: Oct. 26, 1999

[54] RETICLE AND METHOD OF DESIGN TO CORRECT PATTERN FOR DEPTH OF FOCUS PROBLEMS

[75] Inventors: Emery O. Sugasawara, Pleasanton; Mario Garza, Sunnyvale, both of Calif.

[73] Assignee: LSI Logic Corporation, Milpitas, Calif.

[21] Appl. No.: 09/035,110

[22] Filed: Mar. 4, 1998

Related U.S. Application Data

[63] Continuation-in-part of application No. 08/607,398, Feb. 27, 1996, Pat. No. 5,705,301.
[51] Int. Cl.⁶ ........................................ G03F 9/00
[52] U.S. Cl. .................................. 430/5; 430/30
[58] Field of Search ............................ 430/5, 30

[56] References Cited

U.S. PATENT DOCUMENTS 5,705,301  1/1998  Garza et al. ................... 430/5
5,723,233  3/1998  Garza et al. ................... 430/5

*Primary Examiner*—Christopher G. Young
*Attorney, Agent, or Firm*—Beyer & Weaver, LLP

[57] ABSTRACT

A method and apparatus for converting a layout design for the metallization layer integrated circuit pattern to a reticle design having corrections for depth of focus problems. The apparatus includes a design rule checker which is configured to identify locations of the layout design which are expected to produce narrowed regions of the image caused by depth of focus variations at intersections between defined line features of the layout design and the elevated portions of the topographical variations. A depth of focus correction unit is included which is adapted to modify the layout design for the metallization integrated circuit pattern at the locations by increasing the line width of the defined line features from the integrated circuit pattern to correct for these depth of focus problems.

15 Claims, 19 Drawing Sheets

RETICLE AND METHOD OF DESIGN TO CORRECT PATTERN FOR DEPTH OF FOCUS PROBLEMS

Related Application

This application is a continuation-in-part application based upon patent application Ser. No. 08/607,398, filed on Feb. 27, 1996, now U.S. Pat. No. 5,705,301 entitled PERFORMING OPTICAL PROXIMITY CORRECTION WITH THE AID OF DESIGN RULE CHECKERS.

BACKGROUND OF THE INVENTION

The present invention relates to photolithography techniques, and, more particularly, relates to improved methods and apparatuses for performing optical proximity correction techniques to minimize to occurrence of electromigration in conductive lines in the metallization layers caused by topographical variances.

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to a radiation pattern, and then developing the exposed resist in order to selectively protect regions of wafer layers (e.g., regions of substrate, polysilicon, or dielectric).

An integral component of photolithographic apparatus is a "reticle" which includes a pattern corresponding to features at a layer in an IC design. Such reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist.

The resist (sometimes referred to as a "photoresist") is provided as a thin layer of radiation-sensitive material that is spin-coated over the entire silicon wafer surface. The resist material is classified as either positive or negative depending on how it responds to light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor. For further information on IC fabrication and resist development methods, reference may be made to a book entitled *Integrated Circuit Fabrication Technology* by David J. Elliott, McGraw Hill, 1989.

One problem associated with photolithography is that light passing through a reticle is refracted and scattered by the chromium edges. This causes the projected image to exhibit some rounding and other optical distortion. The problems become especially pronounced in IC designs having feature sizes near the wavelength of light used in the photolithographic process.

To remedy this problem, a reticle correction technique known as optical proximity correction ("OPC") has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion likely will result. Then the optical proximity correction is applied to compensate for the distortion. The resulting pattern is ultimately transferred to the reticle glass.

FIGS. 1A through 1D will now be described to illustrate the OPC process. FIG. 1A shows a hypothetical reticle 100 corresponding to an IC layout pattern. For simplicity, the IC pattern consists of three rectangular design features. A clear reticle glass 110 allows radiation to project onto a resist covered silicon wafer. Three rectangular chromium regions 102, 104 and 106 on reticle glass 110 block radiation to generate an image corresponding to intended IC design features.

As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they can not be ignored in layouts having features smaller than about 1 micron.

FIG. 1B illustrates how diffraction and scattering affect an illumination pattern produced by radiation passing through reticle 100 and onto a section of silicon substrate 120. As shown, the illumination pattern contains an illuminated region 128 and three dark regions 122, 124, and 126 corresponding to chromium regions 102, 104, and 106 on reticle 100. The illuminated pattern exhibits considerable distortion, with dark regions 122, 124, and 126 having their corners rounded and their feature widths reduced. Other distortions commonly encountered in photolithography (and not illustrated here) include fusion of dense features and shifting of line segment positions. Unfortunately, any distorted illumination pattern propagates to a developed resist pattern and ultimately to IC features such as polysilicon gate regions, vias in dielectrics, etc. As a result, the IC performance is degraded or the IC becomes unusable.

FIG. 1C illustrates how optical proximity correction may be employed to modify the reticle design shown in FIG. 1A and thereby better provide the desired illumination pattern. As shown, a corrected reticle 140 includes three base rectangular features 142, 144, and 146 outlined in chromium on a glass plate 150. Various "corrections" have been added to these base features. Some correction takes the form of "serifs" 148a–148f and 149a–149f. Serifs are small appendage-type addition or subtraction regions typically made at corner regions on reticle designs. In the example shown in FIG. 1C, the serifs are square chromium extensions protruding beyond the corners of base rectangles 142, 144, and 146. These features have the intended effect of "sharpening" the corners of the illumination pattern on the wafer surface. In addition to serifs, the reticle 140 includes segments 151a–151d to compensate for feature thinning known to result from optical distortion.

FIG. 1D shows an illumination pattern 160 produced on a wafer surface 160 by radiation passing through the reticle 140. As shown, the illuminated region includes a light region 168 surrounding a set of dark regions 162, 164 and 166 which rather faithfully represent the intended pattern shown in FIG. 1A. Note that the illumination pattern shown in FIG. 1B of an uncorrected reticle has been greatly improved by use of an optical proximity corrected reticle.

The OPC process is generally performed by scanning a digitized version of an IC layout design to identify feature dimensions, interfeature spacing, feature orientation, etc. The scanning process may proceed across the IC layout design in a rasterized fashion to cover the entire pattern. In some IC layout designs, it may also be necessary to conduct raster scans in the two or more directions (e.g., horizontal, vertical, and one or more diagonal directions). In some cases, the OPC computations may include generating a detailed computer model of a reticle image known as a Fast Aerial Image of Mask (FAIM). This image is then itself evaluated to determine where to make reticle corrections.

For more information on OPC scanning techniques, reference may be made to U.S. patent application Ser. No. 08/607,365, filed Feb. 27, 1996 (attorney docket No. P-2693/LSI1P044), entitled "Optical Proximity Correction Method And Apparatus", and assigned to LSI Logic Corporation, the assignee of the present application. That application is hereby incorporated by reference for all purposes.

Not surprisingly, the process of performing OPC on modern IC layout designs having many features can be computationally intensive. In fact, the OPC problem can sometimes be too great for even the most advanced computational resources. Obviously, when FAIM models are used, the computational difficulty increases significantly.

One specific type of optical distortion requiring some form of correction is "reflective notching." This form of distortion arises not from the interaction of light with the reticle pattern itself, but from the interaction of light with structures on the wafer surface. Specifically, light directed onto topographical variations introduced on a wafer surface at certain stages in the IC fabrication process (e.g., field oxide formation) scatters and reflects. As a result, illuminated line patterns crossing over a field oxide/active region interface or other topographically varying surface structure possess notches (reflective notching).

Unfortunately, reflective notching tends to degrade integrated circuit performance. For example, the current carrying characteristics of a polysilicon line will deviate from expectation in these narrow regions, potentially leading to hot spots in the polysilicon line. In some cases, such problems may render the resulting integrated circuit unusable.

To illustrate reflective notching, attention is now drawn to FIG. 2A. FIG. 2A is a top view of a semiconductor wafer section 200 having active regions 202 and 204 surrounded by a field oxide 206. Thus, topographical variations exist at the periphery of diffusion regions 202 and 204. When an image of a polysilicon line 208 is projected onto wafer 200 from a reticle, the locations of intersection between the line image and the topographic variations exhibit reflective notching. This is illustrated by notches 210a–210d at region 202 and 211a–211d at region 204.

FIG. 2B is a cross sectional view of semiconductor wafer 200 of FIG. 2A. The cross sectional view 220 shows a substrate 222 having an n-type diffusion region 228 and a p-type diffusion region 229. As is well known in the art, a field oxide layer is grown between diffused active regions as illustrated by field oxide regions 224a–224c. As shown, field oxide regions 224a–224c may extend higher in the vertical direction than diffusion regions 228 and 229. Therefore, when a polysilicon line 226 is formed over the topographically varying semiconductor surface, notches tend to form at surface transitions 230. In some instances, surface transitions may range between about 1500 Å to about 2000 Å

Reflective notching is further discussed in an article entitled *Effects of Wafer Topography on the Formation of Polysilicon Gates*, by Robert Socha et al., Department of Electrical Engineering and Computer Science, University of Calif. at Berkeley and Advanced Micro Devices of Sunnyvale, Calif. (SPIE Proceedings, 1995). This article describes a series of studies directed at reducing reflective notching effects on polysilicon. One proposed solution involves the addition of a TiN anti-reflective coating (ARC) layer and the addition of a dye to the photoresist. The ARC layers and dye materials are designed to increase the absorption of light and decrease reflections and scattering that contribute to reflective notching. Although the addition of an ARC layer reduced some reflective notching, the authors warned that adding another layer is very costly and may cause heavy metal contamination.

Another problem associated with photolithography is that associated with depth of focus or depth of field effects of a metallization layer reticle pattern onto a metal surface having topological variations outside the tolerable plane of focus of the projected reticle image. Unlike "reflective notching" which tends to degrade integrated circuit performance of the polysilicon lines, the depth of focus effects upon elevated regions of the metal surface which are sufficiently above the optimal plane of focus of the reticle image tend to degrade reliability of the affected metal lines.

For example, as shown in FIGS. 3 and 4, depth of focus problems typically originate from a lack of local uniformity in the generally planar metal surface 231 of a wafer section 232. FIG. 3 illustrates a top view of a metal surface 231 of semiconductor wafer section 232 having an underlying polysilicon gates 233, 234 surrounded by a field oxide features 235. Similarly, FIG. 4 illustrates a cross sectional view of the semiconductor wafer section 232 of FIG. 3 which shows a substrate 236 having an n-type diffusion region 237 and a p-type diffusion region 237'. Polysilicon gates 233, 234 are further positioned over diffusion regions 237, 237', respectively. A dielectric layer 238 is then deposited atop the gate level, which in turn includes a metal layer 239 overlaying the dielectric layer 238, wherein the elevated portions 240–244 (illustrated in broken lines) are primarily caused by the underlying polysilicon gates 237, 237' and the field oxide features 235. These elevated regions of the metal layer 239, may extend substantially higher in the vertical direction than the plane of focus 245 of the reticle image and the adjacent valley regions 246.

These local topographical variations, however, are primarily caused by the underlying geometry at the gate level 249 (e.g., the polysilicon gate electrodes 233, 234 and the field oxide features 235). More specifically, when the topographical variations extend sufficiently above and below the plane of focus 245 of the metallization reticle pattern, de-focusing occurs with the affected regions. Such focal problems may occur with topographical variations as little as 0.01 μm.

Therefore, when an image 247, 247' of a metal line (FIG. 4) is projected onto a metal surface 231 from a reticle (not shown), the locations of intersection between the line image and any of these elevated portions 240–244 of the metal surface 231 cause depth of focus problems. These unfocused images of the metal lines are exhibited as metal line thinning which results in narrowed regions 248 of the defined metal line image 247, and in narrowed regions 248' of the defined metal line 247'(FIG. 3).

As a consequence, these narrow regions result in an etched metal line which cause "current crowding" therethrough. These areas of increased resistance become even more apparent when large currents are applied which can cause electromigration. Advanced stages of electromigration may result in line failure and ultimately affect reliability. Hence, as the metal line widths become smaller with more advanced technologies, the importance of electromigration issues increases which in turn further increases the importance of controlling metal line width variations.

Further, as shown in FIGS. 4, depth of focus problems may also occur in the metal layer where the projection of the affected metal line 247' does not even vertically intersect the underlying geometry. However, the underlying geometry, for example the polysilicon gate 234, may be sufficiently close to the vertically projected metal line 247' such that the elevated portion 243 at the metal surface 231 still causes focal disparities to induce depth of focus effects.

While conventional OPC techniques are typically only applied to modify the polysilicon layer, since line width control in this area is considered extremely crucial of performance, such techniques are not applied to mitigate the depth of focus effects, and hence electromigration. For instance, these OPC techniques are typically employed to compensate for photolithographic effects for the purposes of reducing transistor leakage whereby the entire polysilicon line is usually adjusted (biased) upwards (increased) in width. Such width increases along the entire line for electromigration improvements may be problematic due to metal capacitance changes, cross talk, forbidden gap problems or the like. Hence, these techniques are not employed in the photolithography of the metallization layers to address the electromigration problems caused by adjacent lines.

In view of the problems discussed above, what is needed is a computationally economical method of performing OPC to correct for reflective notching and other optical distortions in a reticle images.

SUMMARY OF THE INVENTION

The present invention fills this need by providing methods for quickly identifying regions where optical proximity correction will be most useful and then performing corrections only at those regions. In one aspect, the present invention provides a computer-implemented method for performing optical proximity correction on an integrated circuit layout design. The method may be characterized as including the following steps: (a) analyzing the integrated circuit layout design with a design rule checker to locate features of the integrated circuit layout design meeting predefined criteria; and (b) performing optical proximity correction on the features meeting the criteria in order to generate a reticle design. This saves considerable computation by removing from consideration some fraction of the design features in the integrated circuit layout design—i.e., the fraction of features not meeting the predefined criteria.

Examples of suitable criteria for selecting features include inside corners of features, outside corners of features, polygonal classes of features (e.g., triangles, trapezoids, pentagons, etc.), feature size (such line width, via width, etc.), interfeature spacing, angle sizes of features, etc.

In one specific embodiment, the design rule checker is set to select only those features having a critical dimension of smaller than about 1 micron. In other words, the design rule checker identifies all those features having a critical dimension of less than about 1 micron and optical proximity correction is limited to those features only. In another specific embodiment, the design rule checker identifies the outer corners of all features in an IC layout design. The optical proximity correction performs a specific correction (e.g., adding a serif) only at the outer corners.

Another aspect of the present invention provides a method of designing a reticle which is corrected for reflective notching. The method may be characterized as including the following steps: (a) obtaining a layout design for the integrated circuit pattern to be formed on a wafer surface; (b) identifying locations on feature edges of the integrated circuit pattern, which locations are expected to produce an image that will intersect topographical variations on the wafer surface; and (c) producing a reticle design by modifying the layout design for the integrated circuit pattern such that the locations on the feature edges include deviations from the integrated circuit pattern to correct for reflective notching.

In a preferred embodiment, the locations on the integrated circuit pattern chosen for correction correspond to locations where field oxide feature edges on a field oxide integrated circuit pattern intersect gate electrode feature edges on a layout design undergoing correction for reflective notching. In such embodiments, the deviations from the layout design for the integrated circuit pattern are provided on line features of the pattern such that line widths are increased at the locations which are expected to produce regions of an image that will intersect the topographical variations. In especially preferred embodiments, the line widths are increased by adding rectangular regions of constant specified dimensions centered on the locations chosen for correction.

After a reticle design is produced in accordance with this invention, that design may be transferred to a physical medium (e.g., glass and chrome) to produce an actual reticle for use in photolithography.

Some methods of this invention may conveniently be performed on an apparatus such as a digital computer which includes (a) a design rule checker for identifying locations on the integrated circuit pattern which intersect the topographical variations; and (b) a reflective notching correction unit which modifies the layout design for the integrated circuit pattern at the locations such that reflective notching is reduced in the image. These two elements may be implemented as software designed to operate in a standalone manner or in conjunction with each other. The design rule checker is particularly well adapted to identify the locations where one integrated circuit pattern intersects a second integrated circuit pattern, as where feature edges on a field oxide pattern intersect feature edges on gate electrode pattern. This information can be used by the reflective notching correction unit to place "correction blocks" at the intersection locations, thereby increasing image line widths at topographical variations on the wafer surface.

In yet another aspect of the present invention, a method of designing a reticle is provided for producing an image of a metallization layer integrated circuit pattern when radiation is directed through the reticle and onto a resist coated metal surface of a wafer. The reticle of the present invention is corrected for depth of focus problems caused by the projection of the image onto elevated portions of topographical variations of the metal surface which result from the underlying geometry. The method includes the steps of: (a) obtaining a layout design for the metallization layer integrated circuit pattern to be formed on the metal surface; and (b) identifying locations on the defined line features which are expected to produce narrowed regions of the image caused by depth of focus variations at their intersections with the elevated portions of the topographical variations. This method further includes the step of (c) producing a reticle design by modifying the layout design for the metallization layer integrated circuit pattern such that the locations on the defined line features include line width increases from the integrated circuit pattern to correct for these depth of focus problems.

The identifying step is preferably performed with the aid of design rule checking which identifies the locations by determining where the underlying geometry of a gate level integrated circuit pattern intersects metal line features on the layout design for the metallization layer integrated circuit pattern. The underlying geometry of the gate level includes the gate features on a gate integrated circuit pattern. Further, the underlying geometry of the gate level includes the field oxide features on a field oxide integrated circuit pattern.

In still another embodiment of the present invention, a converting apparatus is included for converting a layout design for the metallization layer integrated circuit pattern to a reticle design having corrections for depth of focus problems. The converting apparatus includes a design rule checker which is configured to identify locations of the layout design which are expected to produce narrowed regions of the image caused by depth of focus variations at intersections between defined line features of the layout design and the elevated portions of the topographical variations. A depth of focus correction unit is included which is adapted to modify the layout design for the metallization integrated circuit pattern at the locations by increasing the line width of the defined line features from the integrated circuit pattern to correct for these depth of focus problems.

The design rule checker is configured such that the narrowed regions of the image are estimated to occur where the elevated portions at the intersection of the defined line features are expected to surpass a predetermined height. In one specific embodiment, the predetermined height is in the range of about 0.005 $\mu$m to about 0.010 $\mu$um. In another specific embodiment, the correction unit is adapted to modify the location by adding rectangular regions of constant specified dimensions centered on the locations.

In another embodiment, a reticle design is provided having correction for depth of focus problems caused by the projection of an image of a metallization layer integrated circuit pattern onto elevated portions of topographical variations of a metal surface of a wafer which result from the underlying geometry. The reticle design includes a layout design for the metallization layer integrated circuit pattern modified such that defined line feature locations on the layout design that intersect the elevated portions of the topographical variations contain increased line widths of the defined line feature from the integrated circuit pattern which reduce depth of focus problems in the image.

These and other features and advantages of the present invention will become apparent upon reading the following detailed descriptions and studying the various figures of the drawings.

DETAILED DESCRIPTION OF THE PROFFERED EMBODIMENTS

1. Processing Environment

Figure 1A:
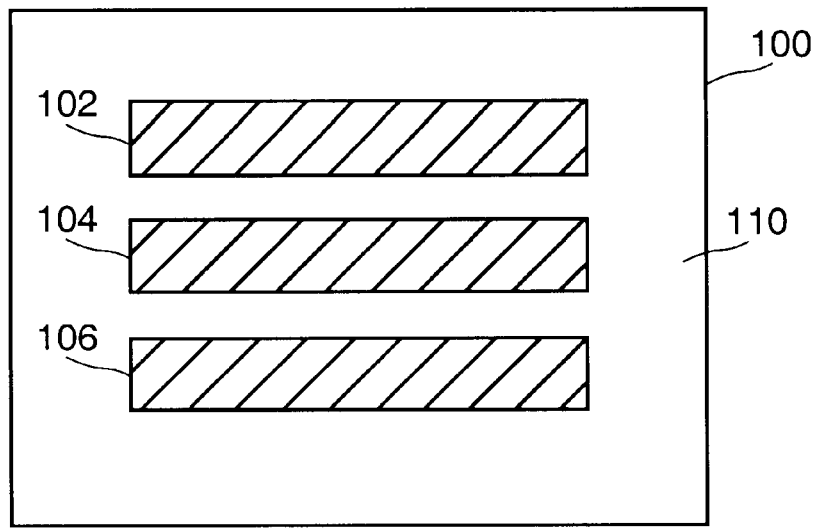
FIG. 1A illustrates a conventional reticle having an IC design pattern outlined in, for example, chromium on a glass backing.
Figure 1B:
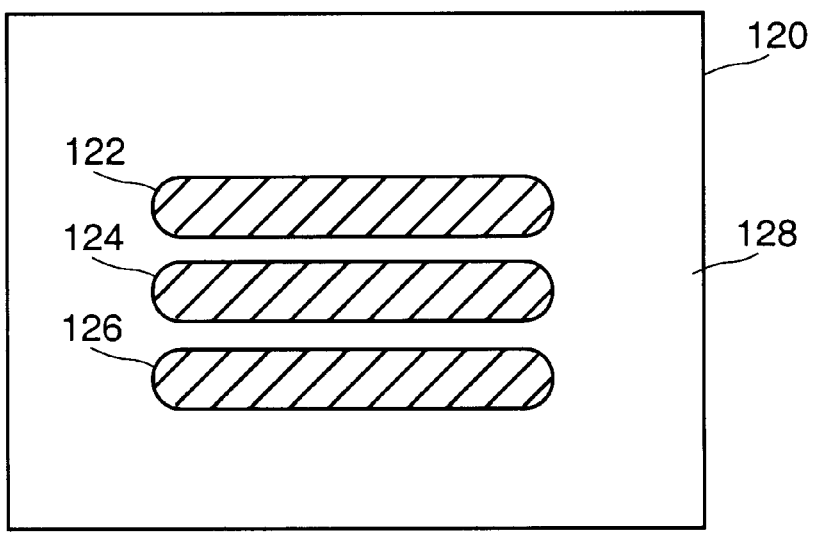
FIG. 1B shows an illumination pattern produced on a substrate by light shown through the reticle of FIG. 1A. The illumination pattern exhibits rounding and thinning effects that result when no optical proximity correction is performed.
Figure 1C:
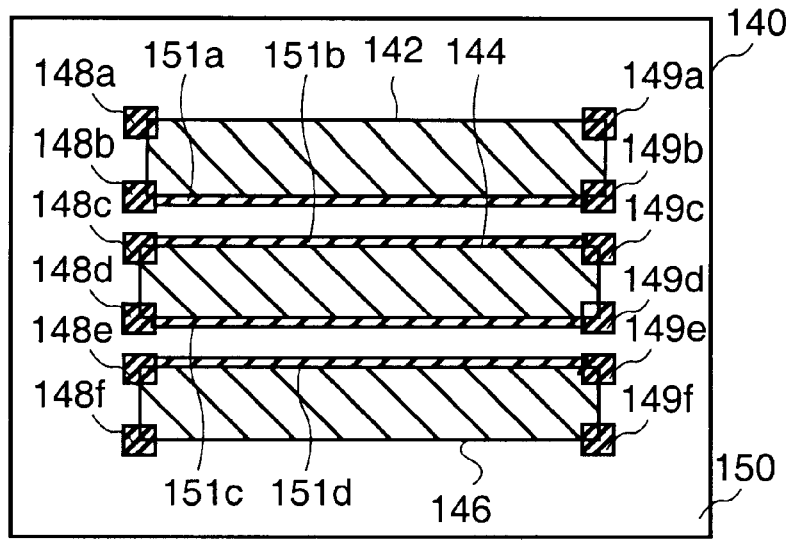
FIG. 1C illustrates a conventional reticle design employing optical proximity correction to overcome the rounding and thinning effects in the illumination pattern of FIG. 1B.
Figure 1D:
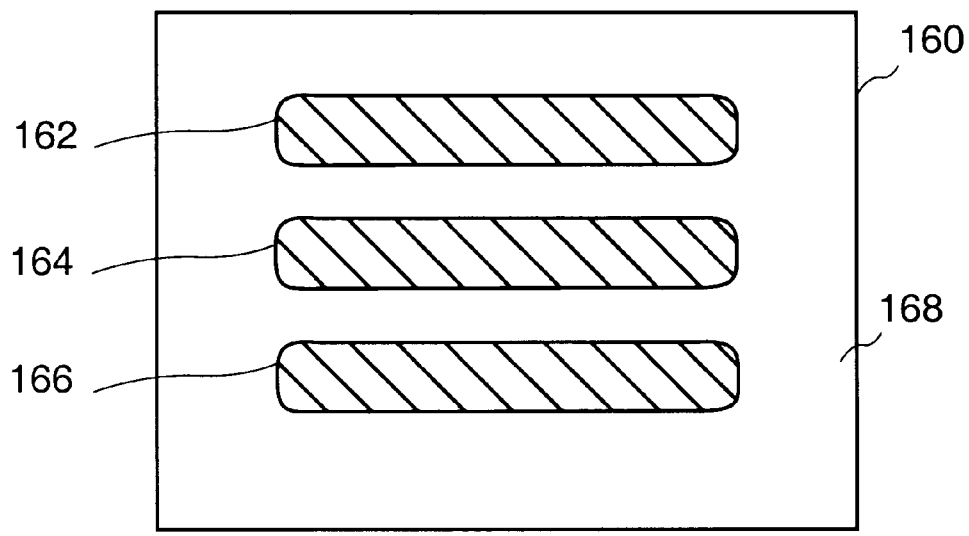
FIG. 1D shows an improved illumination pattern produced on a substrate by light shown through the optical proximity corrected reticle of FIG. 1C.
Figure 2A:
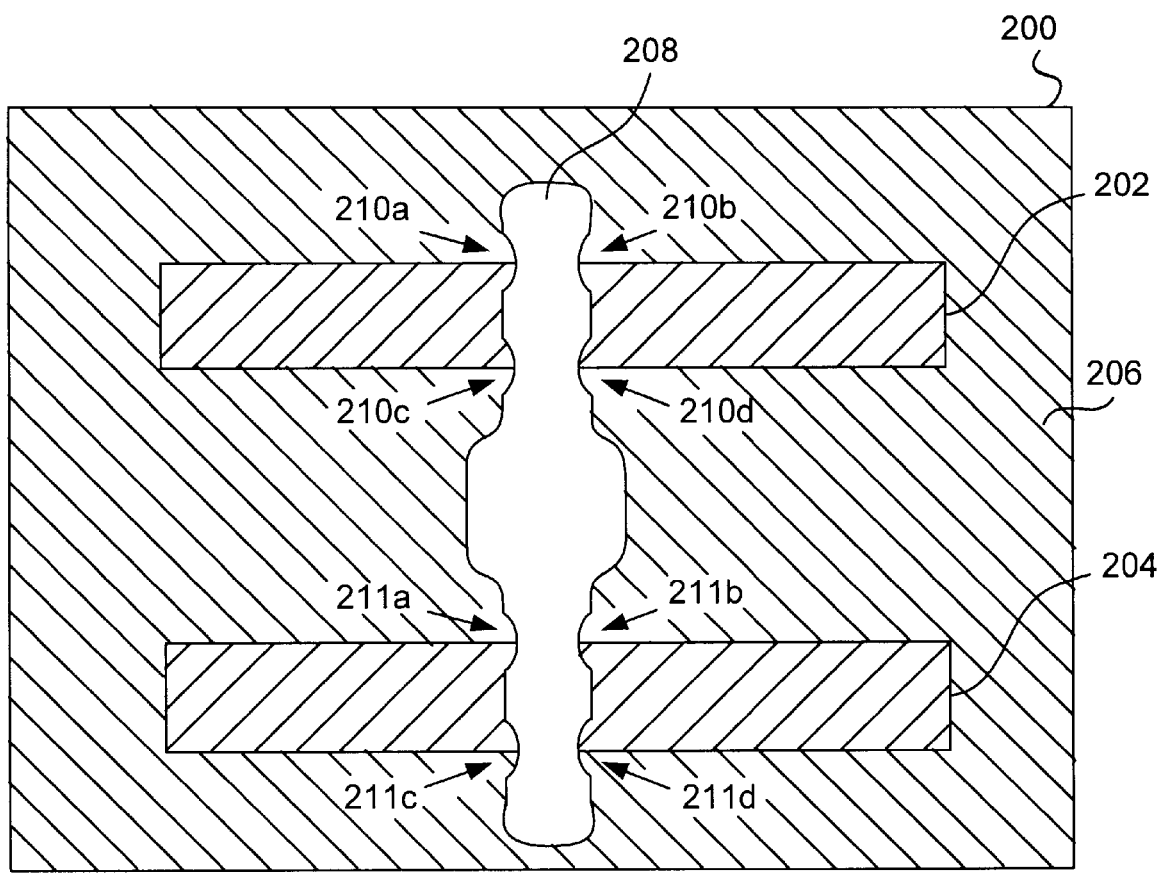
FIG. 2A is a top view of a semiconductor device having diffused regions (well regions) and a polysilicon line showing unwanted reflective notching effects.
Figure 2B:
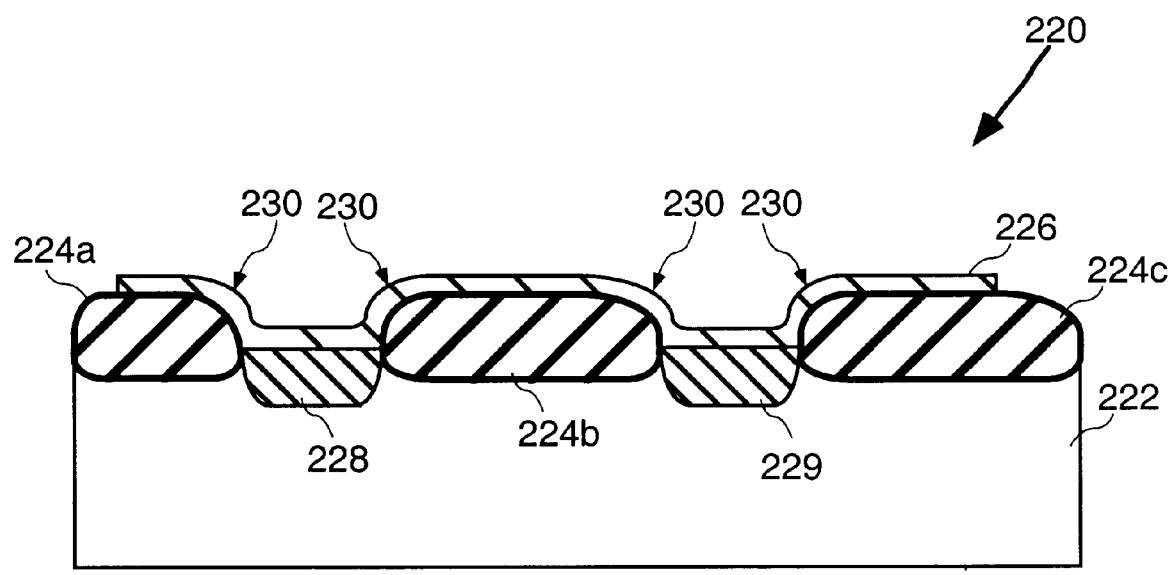
FIG. 2B is a cross sectional view of the semiconductor device of FIG. 1A illustrating common topographical variations.

FIGS. 1A through 1D, as described above, illustrate conventional methods of performing optical proximity correction (OPC). Conventional methods have been found to be slow and generally computationally inefficiently at correcting IC layout designs. In addition, FIGS. 2A through 2B illustrate reflective notching effects resulting at topographically varying wafer surfaces.

Figure 5:
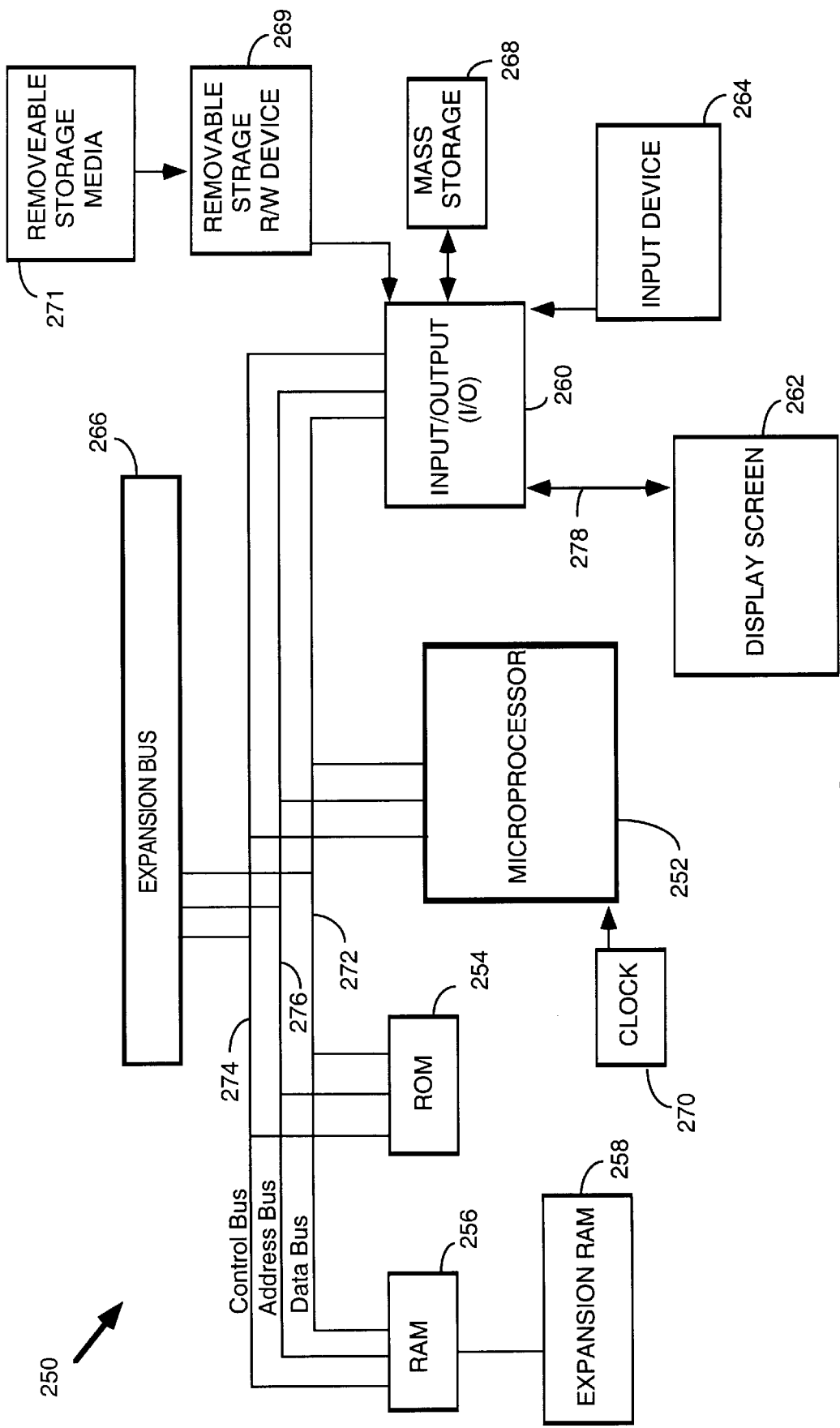
FIG. 5 illustrates a general purpose computer system, representing a suitable computer platform for implementing the improved optical proximity of correction technique.

FIG. 5 is an illustration of a general purpose computer system, representing one of many suitable computer platforms for implementing the inventive optical proximity correction methods described below. FIG. 5 shows a general purpose computer system 250 in accordance with the present invention includes a central processing unit (CPU) 252, read only memory (ROM) 254, random access memory (RAM) 256, expansion RAM 258, input/output (I/O) circuitry 260, display assembly 262, input device 264, and expansion bus 266. Computer system 250 may also optionally include a mass storage unit 268 such as a disk drive unit or nonvolatile memory such as flash memory and a real-time clock 270.

CPU 252 is coupled to ROM 254 by a data bus 272, control bus 274, and address bus 276. ROM 254 contains the basic operating system for the computer system 250. CPU 252 is also connected to RAM 256 by busses 272, 274, and 276. Expansion RAM 258 is optionally coupled to RAM 256 for use by CPU 252. CPU 252 is also coupled to the I/O circuitry 260 by data bus 272, control bus 274, and address bus 276 to permit data transfers with peripheral devices.

I/O circuitry 260 typically includes a number of latches, registers and direct memory access (DMA) controllers. The purpose of I/O circuitry 260 is to provide an interface between CPU 252 and such peripheral devices as display assembly 262, input device 264, and mass storage 268.

Display assembly 262 of computer system 250 is an output device coupled to I/O circuitry 260 by a data bus 278. Display assembly 262 receives data from I/O circuitry 260 via bus 278 and displays that data on a suitable screen.

The screen for display assembly 262 can be a device that uses a cathode-ray tube (CRT), liquid crystal display (LCD), or the like, of the types commercially available from a variety of manufacturers. Input device 264 can be a keyboard, a mouse, a stylus working in cooperation with a position-sensing display, or the like. The aforementioned input devices are available from a variety of vendors and are well known in the art.

Some type of mass storage 268 is generally considered desirable. However, mass storage 268 can be eliminated by providing a sufficient amount of RAM 256 and expansion RAM 258 to store user application programs and data. In that case, RAMs 256 and 258 can optionally be provided with a backup battery to prevent the loss of data even when computer system 250 is turned off. However, it is generally desirable to have some type of long term mass storage 268 such as a commercially available hard disk drive, nonvolatile memory such as flash memory, battery backed RAM, PC-data cards, or the like.

A removable storage read/write device 269 may be coupled to I/O circuitry 260 to read from and to write to a removable storage media 271. Removable storage media 271 may represent, for example, a magnetic disk, a magnetic tape, an optomagnetic disk, an optical disk, or the like. Instructions for implementing the inventive method may be provided, in one embodiment, to a network via such a removable storage media.

In operation, information is inputted into the computer system 250 by typing on a keyboard, manipulating a mouse or trackball, or "writing" on a tablet or on position-sensing screen of display assembly 262. CPU 252 then processes the data under control of an operating system and an application program stored in ROM 254 and/or RAM 256. CPU 252 then typically produces data which is outputted to the display assembly 262 to produce appropriate images on its screen.

Expansion bus 266 is coupled to data bus 272, control bus 274, and address bus 276. Expansion bus 266 provides extra ports to couple devices such as network interface circuits, modems, display switches, microphones, speakers, etc. to CPU 252. Network communication is accomplished through the network interface circuit and an appropriate network.

Suitable computers for use in implementing the present invention may be obtained from various vendors. In one preferred embodiment, an appropriately programmed HP735 workstation (Hewlett Packard, Palo Alto, Calif.) may be used to perform the steps associated with this invention. Various other computers, however, may be used depending upon the size and complexity of the OPC tasks. Suitable computers include mainframe computers such as a VAX (Digital Equipment Corporation, Maynard, Mass.) or Cray Supercomputer (Cray Research), multiprocessor computers such as those produced by Thinking Machines (Cambridge, Mass.), workstations such as the Sun SPARC (Sun Microsystems, Sunnyvale, Calif.) or Silicon Graphics machines (Silicon Graphics, Mountain View, Calif.), personal computers such as Macintosh computers (Apple Computer, Cupertino, Calif.) or IBM or IBM compatible personal computers.

It should be understood that the present invention also relates to machine readable media on which are stored reticle designs meeting the requirements of this invention, or program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer. Specific embodiments of the present invention will now be described with reference to FIGS. 6 through 11.

Figure 6:
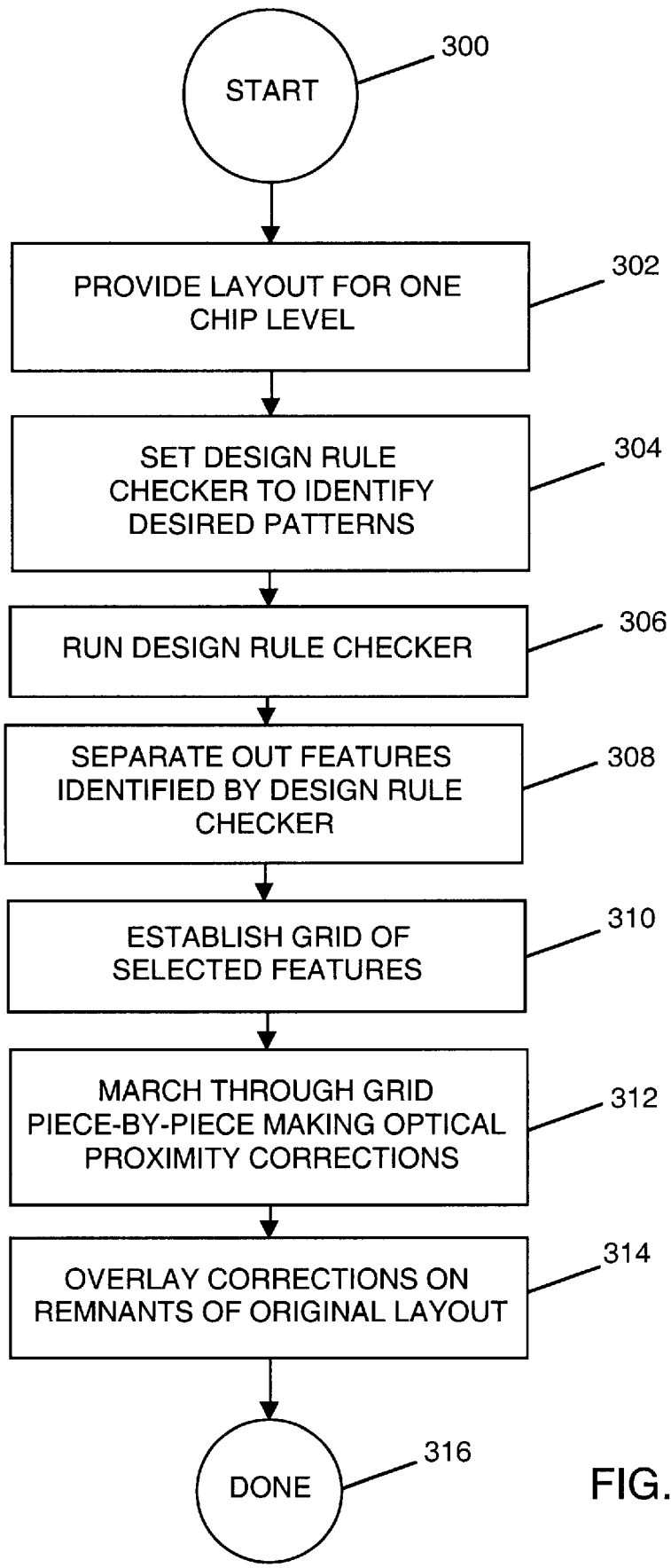
FIG. 6 is a process flow diagram illustrating the steps involved in correcting an IC layout design in accordance with one embodiment of this invention.

2. Method for Improving Computational Efficiency in Optical Proximity Correction FIG. 6 illustrates one process for performing optical proximity correction (OPC) in accordance with this invention. The process begins at 300 and proceeds to a step 302 where an IC layout design is provided for one chip level. As is well known in the art, integrated circuits are built up in a number of layers, each of which requires at least one mask/reticle for producing the desired IC layout on the wafer surface. Typically, the layout required of step 302 will be a digital representation of the exact pattern intended to be produced on the wafer surface. Such digital representations are commonly provided at the tape out stage of an IC design procedure. This invention may also be employed to other representations as well, such as reticle designs that have already been subjected to some degree of correction.

After the layout is obtained at step 302, the method proceeds to a step 304 where a design rule checker (DRC) software unit is configured to identify specific features such as predefined critical dimensions or geometric shapes. From step 304, the method proceeds to a step 306 where the DRC software is executed to actually identify the selected specific features in the layout obtained in step 302. Once these features are identified, the method proceeds to a step 308 where the identified features are separated from the remaining of the features (i.e., features not identified by the design rule checker in step 306). This produces a new DRC file containing only the identified features. The original IC layout design or at least coordinates of the unselected coordinates are retained in a separate file.

Figure 7:
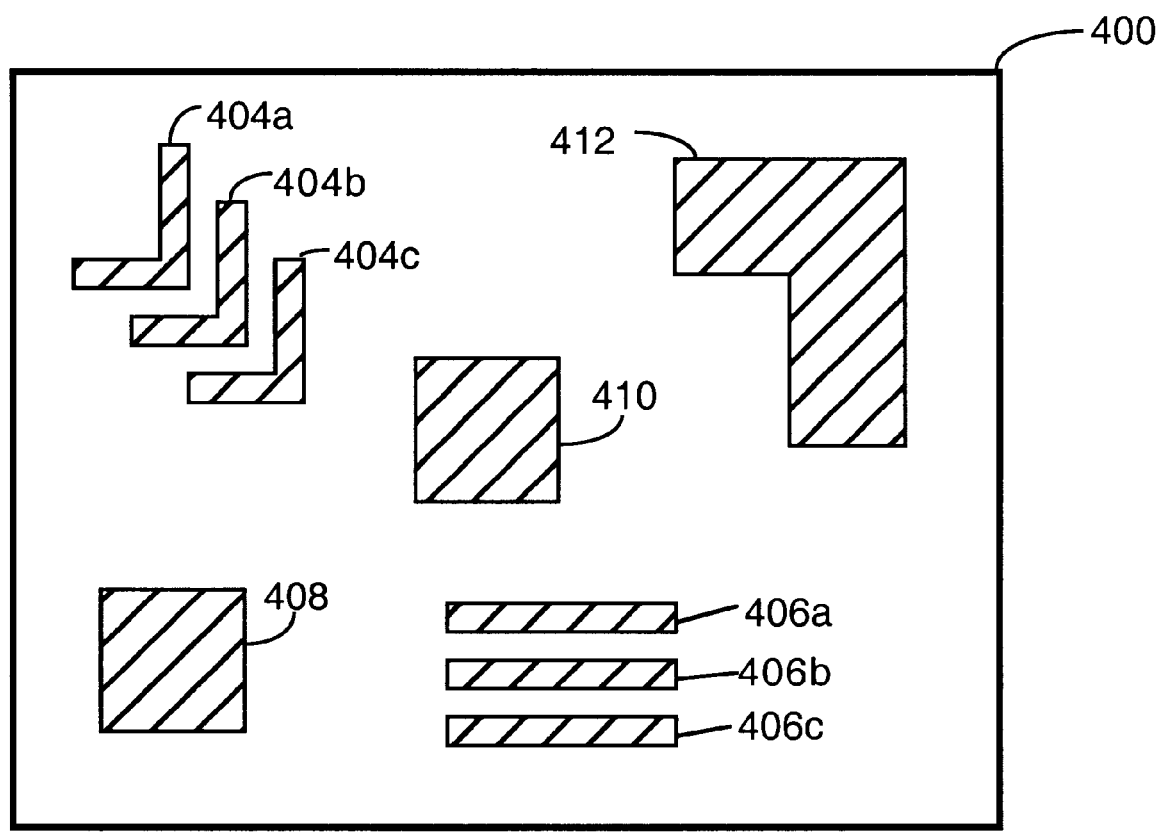
FIG. 7 is an IC layout design having a sets of small features and a set of large features.
Figure 7A:
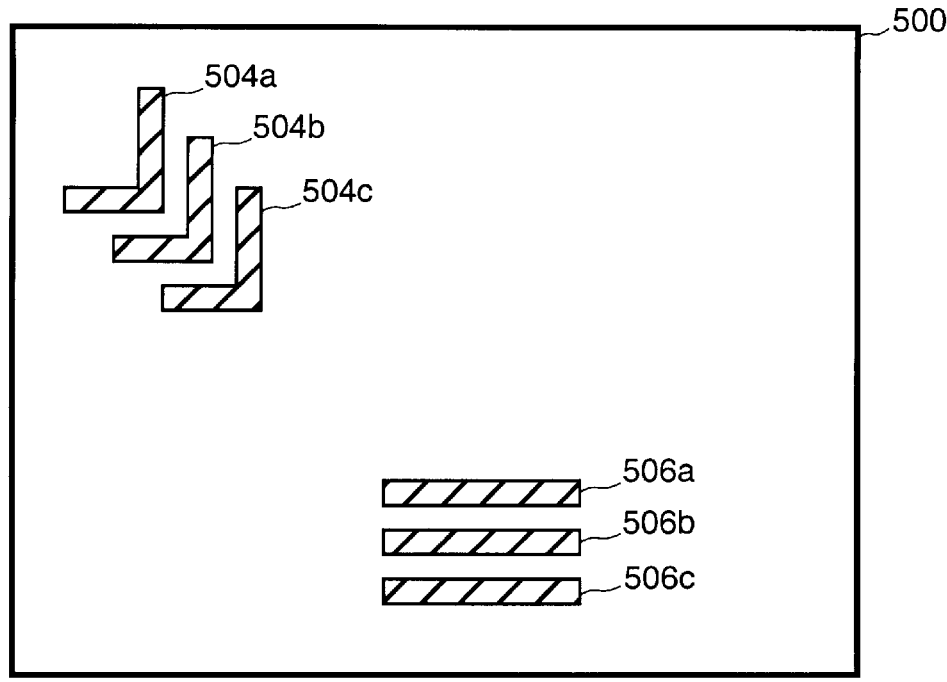
FIG. 7A illustrates the IC layout design of FIG. 6 after the set of large features are digitally removed.
Figure 7B:
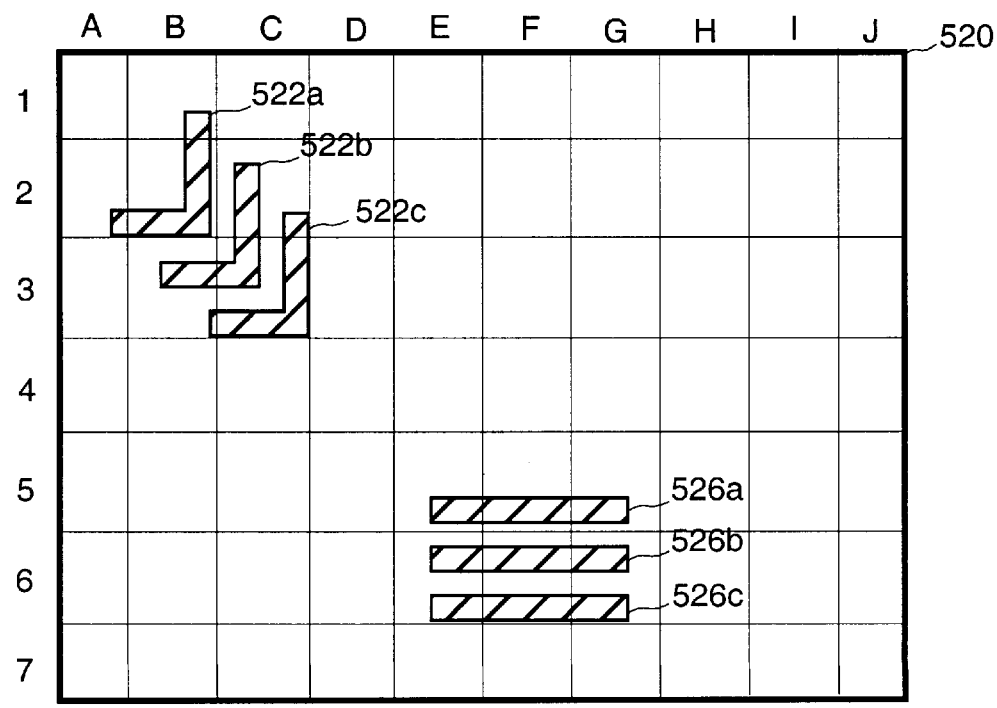
FIG. 7B shows, in one embodiment, the IC layout design of FIG. 7A having a grid overlaying the IC layout design.

From step 308, the method proceeds to a step 310 where the segregated layout design (i.e., having features identified in step 308) is divided into grid regions laid out in, for example, a row and column formation (e.g., as illustrated in FIG. 7B below). From step 310, the method proceeds to a step 312 where optical proximity correction (OPC) software sequentially operates on each grid region. Preferably, those grid regions enclosing no selected layout features are quickly identified by the OPC software before substantial computation is performed. When such regions are encountered, the OPC software will then skip to the next grid region where it will determine whether a selected feature is present. In those grid regions containing selected layout features, the OPC software performs corrections on the layout features as appropriate. As can be appreciated, because the computations involved in performing OPC corrections are avoided for grid regions not having features, a great number of excess computations are avoided. Further, because the design rule checker has eliminated unimportant features before the grid is ever formed, the OPC software will not act on such unimportant features in those grid regions where OPC must be performed.

After OPC has been performed as necessary on each grid region (step 312), the system combines, at a step 314, the corrected features (from the appropriate grid regions) with the unselected features remaining from step 304. As mentioned above, the DRC software was instructed identify only features meeting specified criteria. Performing step 314 produces a combined a reticle pattern having the uncorrected features which did not meet the DRC selection criteria together with corrected features which did meet the DRC selection criteria. With recombined reticle design in hand, the process is concluded at 316.

The resulting reticle design is converted to a "physical" reticle by a standard process. For example, a digital representation of the reticle design is electronically transferred to a manufacturing electron beam exposure system ("MEBS") which generates a reticle corresponding to the design. The process by which the MEBS takes the electronic version of the reticle and converts it to a physical version is a rather complex but it is widely employed today. Stated simply, the process involves moving an electron beam over an electrostatic medium as specified by the electronic representation of the reticle. The output of this process is a reticle having transparent and translucent regions corresponding to the reticle layout. In visible and ultraviolet photolithography, the translucent regions may be defined by chromium or chromium oxide on a glass substrate, for example. In other, more advanced, photolithography processes such as X-ray lithography, a beryllium media may be used.

As should be apparent from the above discussion, a central component of the present invention is a design rule checker or other pattern analyzer for identifying/selecting features meeting preselected criteria in a layout pattern. Such criteria are typically set by a user initiating execution of the checker, but may be automatically generated anytime the checker analyzes a pattern. Many DRC systems have been devised to check entire designs for design rule violations associated with a particular fabrication process. Design rules may represent, for example, minimum interfeature spacing, minimum via hole separations, etc. In operation, a DRC is instructed to identify certain of these feature characteristics. The present invention adapts this capability to quickly identify features that are candidates for OPC, without regard for design rule violations.

The design rule checker is typically a software program or module which is provided by an established vendor. However, knowing the desired function of the checker for purposes of this invention, one of skill could routinely construct such software to carry out some aspects of this invention. Regardless of whether the DRC software is obtained from a vendor or specially programmed, it should be written to identify interesting features with a minimum of computation. Further, it should be adapted to receive a digital representation of the layout pattern to be analyzed. As mentioned such patterns are typically provided as a digital representation of a desired wafer pattern. Such representations specify in a standard format the coordinates of defined edges on the pattern. While most such layout representations are generated via computer aided design (CAD) software, others may be generated by scanning a pattern into digital form or some other technique.

DRC software suitable for use with this invention may be purchased from vendors such as Integrated Silicon Systems, Research Triangle Park, N.C. OPC software for use with this invention may be provided as a stand-alone module for acting on the DRC output or may be provided as a component of a larger DRC/OPC software module. Either way, it should perform defined corrections on features selected by the DRC. Such corrections may include adding (or subtracting) serifs and/or bar segments as illustrated in FIG. 1C. Other optical proximity corrections known to those of skill in the art may also be employed with this invention.

In some embodiments, the OPC software may perform detailed calculations to assess an appropriate "amount" of corrections. For example, the OPC software may calculate an amount of correction based upon a non-linear expression for amount of OPC correction as a function of critical dimension. Such technique is described in U.S. patent application Ser. No. 08/607,365, filed Feb. 27, 1996 (attorney docket number P-2693/LSI1P044) previously incorporated by reference. Also, the OPC software may employ FAIM software to determine an amount and type of correction. Such techniques are computationally expensive and sometimes can not be employed because the pattern being analyzed simply presents too large a problem. However, the present invention can considerably reduce the problem size by first removing those features for which OPC will provide only relatively small improvement.

In other embodiments, the OPC software may perform comparatively rudimentary calculations such, as placing a rectangular serif of a preset size on every outside corner of a feature greater than a defined size (e.g., 0.5 $\mu$m). The DRC would have previously presented to the OPC software a list of corners meeting the specified requirement. Then the OPC software performs the desired corrections expeditiously.

The range of criteria that may be checked by a DRC operating in accordance with this invention include most any class of pattern features that may require optical proximity correction. Such pattern features include, by way of example only, inside corners of features, outside corners of features, polygonal classes of features (e.g., triangles, trapezoids, pentagons, etc.), feature size (such line width, via width, etc.), interfeature spacing, angle sizes of features, etc.

Often a design rule checker may be advantageously employed to identify features smaller than a prespecified size. The quality of a reticle image improves most significantly by correcting the smaller features. Often correction of larger features provides minimal improvement in reticle quality but requires significant additional computer resources. With this in mind, a specific example requires that the DRC software identify all features having critical dimensions smaller than about 1 $\mu$m. Depending upon the wavelength of radiation employed, the optical elements of the photolithography system and other factors, the cut-off size may be smaller or larger than 1 $\mu$m. In another specific example, the DRC may be set to identify only those features having critical dimensions smaller than a value in the range of 0.4 to 0.5 $\mu$m.

An example of how a design rule checker may be employed to reduce the calculations required of OPC software is illustrated in FIGS. 7, 7A–D), and 8. FIG. 7 presents a simple hypothetical IC layout design 400 having features of various sizes. The features are divided into a first group of smaller features and a second group of larger features. The first group includes two sets of relatively small features. These include a set of three "elbow" shaped features 404a–404c and a set of three "line" features 406a–406c. The group of larger features includes an elbow shaped feature 412 and square features 408 and 410.

The layout design 400 is provided in a digital form to a DRC set to select only those features of a size smaller than the features in second group. Thus, the DRC selects features 404a, 404b, 404c, 406a, 406b, and 406c, but does not select features 408, 410, and 412. This produces a partial IC layout design 500 having only small features 504a–504c and 506a–506c as shown in FIG. 7A. This partial layout 500 is provided as a new file having coordinates for each of small features 504a–504c and 506a–506c as described with reference to step 308 of FIG. 5. As can be seen, the small features maintain their original coordinate location shown in FIG. 7.

Next the partial layout design 500 is divided into a series of grid regions to produce a grid 520 shown in FIG. 7B. Grid 520 is digitally generated before OPC is performed. As shown, grid 520 is shown divided into rows (1–7) and columns (A–J) such that some features lie completely or partially within a single grid region. Some grid regions have no part of any feature within their boundaries. For example, grid region (A1) has no feature within its boundary, while grid region (B1) has part of feature 522a within its boundary. The remaining parts of feature 522a are enclosed within grid regions (B2) and (A2).

As indicated in the discussion of FIG. 5, once the partial layout design has been overlaid with a grid (e.g., grid 520), the OPC software will perform the required computations for performing OPC corrections. The OPC software (or associated software) is provided with instructions to march across the IC layout design and perform corrections one grid region at a time. For example, the process may begin at grid region (A1). When the OPC software determines that no feature is present in grid region (A1), it skips to the next grid region (e.g., grid region B1) without performing time consuming computations. However, it should be understood that the OPC scanning process may be adjusted to scan the IC layout design in any direction and to begin and end at any preselected grid region. For example, the OPC software may scan in the vertical direction beginning with grid region (A7) and proceeding to grid region (A1).

Independent of scanning direction, the process is designed to avoid performing time consuming computations where no features is present. It should also be borne in mind that grid 520 may be adjusted to increase grid density. Increasing grid density may be necessary in order to further optimize OPC scanning processes when very small features are present. Conversely, if very large features are present, grid density may be decreased.

It should be understood that the grid system shown in FIG. 7B is not necessary to the practice of this invention. It is illustrated to show one efficient procedure for dividing up a complex OPC problem into smaller simpler segments.

Figure 7C:
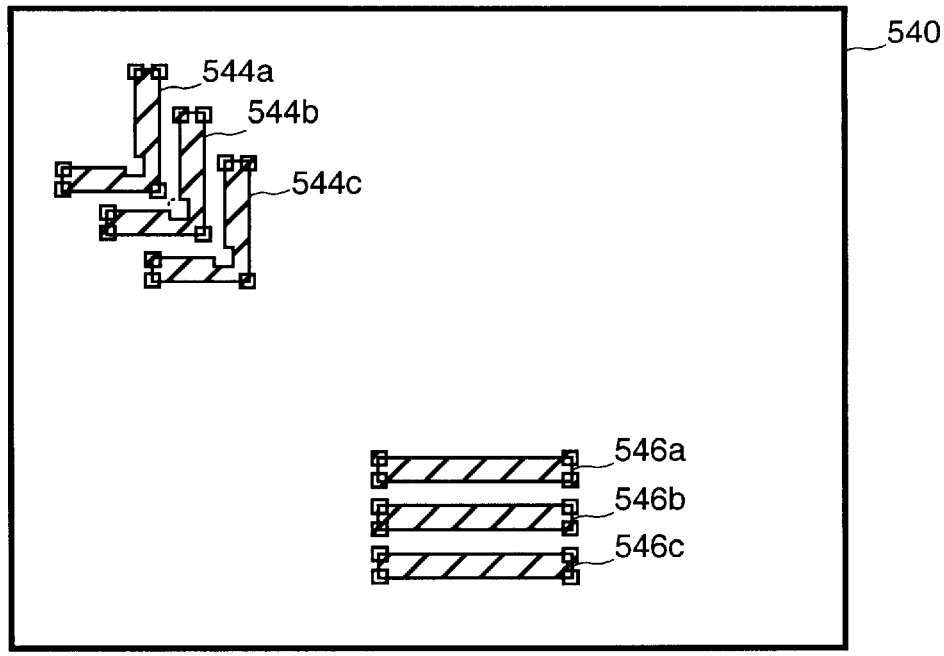
FIG. 7C shows the set of small features of FIG. 6 corrected by the improved optical proximity correction method.

Once the OPC software has completed the correction process for partial layout design 500 of FIG. 7, a corrected partial design is generated. In this example, FIG. 7C illustrates a corrected IC layout design 540. As shown, a number of serifs have been added to each corner of features 544a–544c and 546a–546c. In addition, serifs were subtracted from the inside corners of features 544a–544c.

Figure 7D:
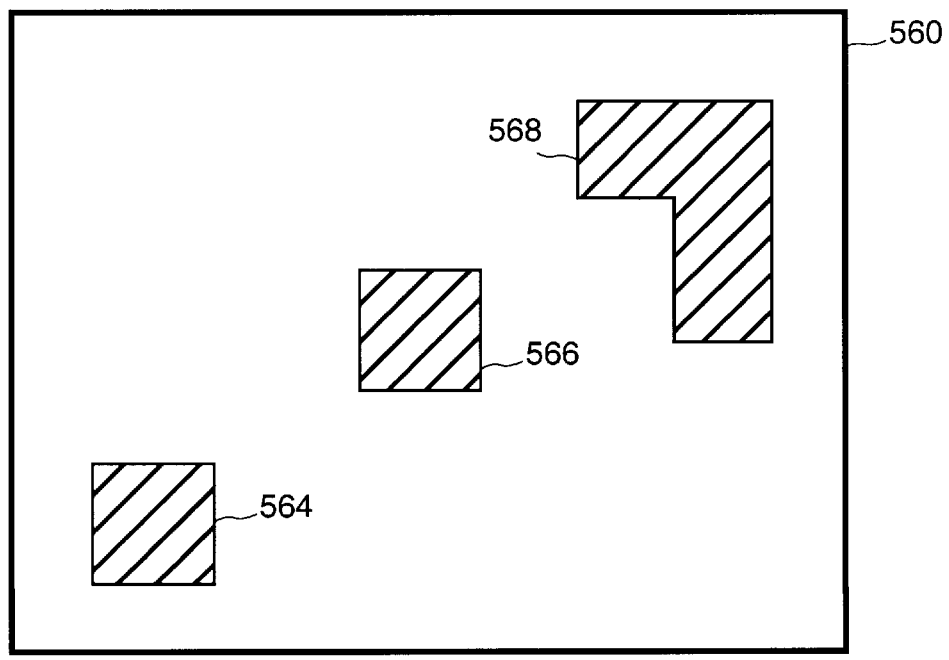
FIG. 7D shows the IC layout design of FIG. 6 after the set of small features are digitally removed.

FIG. 7D shows a second partial IC layout design 560 representing the remnants of IC layout design 400 of FIG. 7 (after the DRC software identified and extracted the features meeting the predefined size criteria). As shown, the partial design 560 includes large features 564, 566, and 568 corresponding to features 408, 410, and 412 shown in the layout 400 of FIG. 7. As mentioned above, when the smaller features were identified and placed into a new DRC file, the original coordinate locations were maintained. Similarly, the coordinate locations of the remaining larger features of FIG. 7D were also maintained. The information provided in partial design 560 may be preserved in the original design layout file are put into a new separate file.

Figure 8:
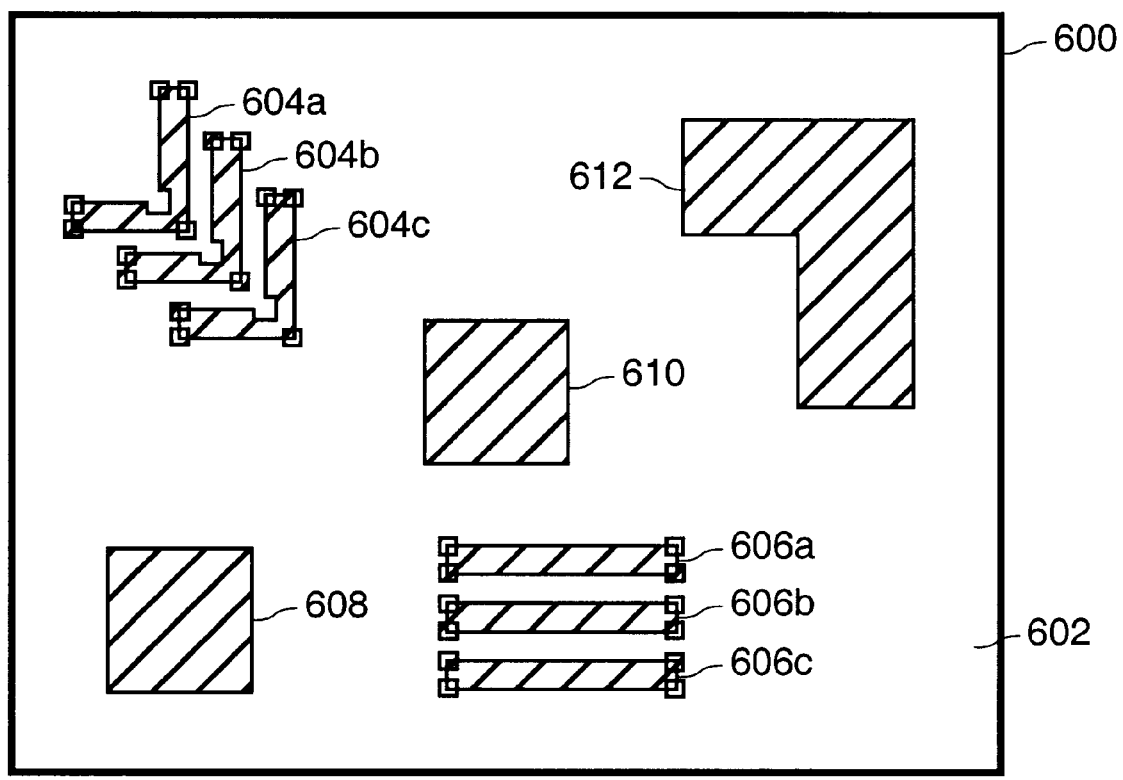
FIG. 8 shows the IC layout design of FIG. 7C combined with the IC layout design of FIG. 7D to form a corrected IC layout design.

Next, the partial IC layout designs of FIGS. 7C and 7D are combined to form a final corrected design. FIG. 8 is an illustration of that corrected IC layout design 600. The corrected IC layout design 600 shows both the larger uncorrected features 608, 610 and 612 and the smaller corrected features 604a–604c and 606a–606c on the same design. At this point, IC layout design 600 may be transferred onto an actual glass and chromium (or other material) reticle.

By performing the aforementioned process steps, OPC con-ection time (for an average IC layout design) may be decreased from a number of weeks to as little as a few hours on a conventional workstation computer.

3. Method for Correcting for Reflective Notching

This aspect of the invention provides a method and apparatus for reducing reflective notching by first identifying where reflective notching is likely to occur on a reticle image and then making corrections to a reticle design at corresponding locations. As noted above, reflective notching is an effect caused by projection of a reticle image onto topographically variations of a wafer surfaces (see FIGS. 2A and 2B and the associated discussion). Thus, a reticle design procedure in accordance with this aspect of the invention first identifies positions where feature edges on a reticle pattern intersect topographical variations on a wafer surface. Then, the procedure modifies the reticle design at such positions to mitigate the effect of reflective notching.

Image features susceptible to reflective notching include images of gate electrodes which straddle boundaries between active regions and field oxides. To correct a reticle for such effects, gate electrode line widths may be increased at such locations. Thus, in the case of a positive resist for example, the dark region associated with a gate electrode line may have to be made wider at the intersection with a field oxide/active region boundary. In preferred embodiments, the increased width is provided by placing rectangles of a defined size on the line feature edges of a reticle design.

In a preferred embodiment, the reflective notching correction method utilizes design rule checker software to identify intersections between edges of pertinent features on different reticle designs. As mentioned above, DRC software may be used to identify many specific feature characteristics such as "feature corners" and distinguish between features having large or small critical dimensions. As applied to reflective notching correction, the DRC might evaluate IC layout designs for a field oxide mask and a gate electrode mask. By analyzing the two layout designs, the DRC can quickly identify all locations where polysilicon lines intersect field oxide boundaries. Once such intersections are ascertained, other software procedures correct the polysilicon reticle design at the ascertained reticle locations in order to compensate for anticipated reflective notching effects.

Figure 9A:
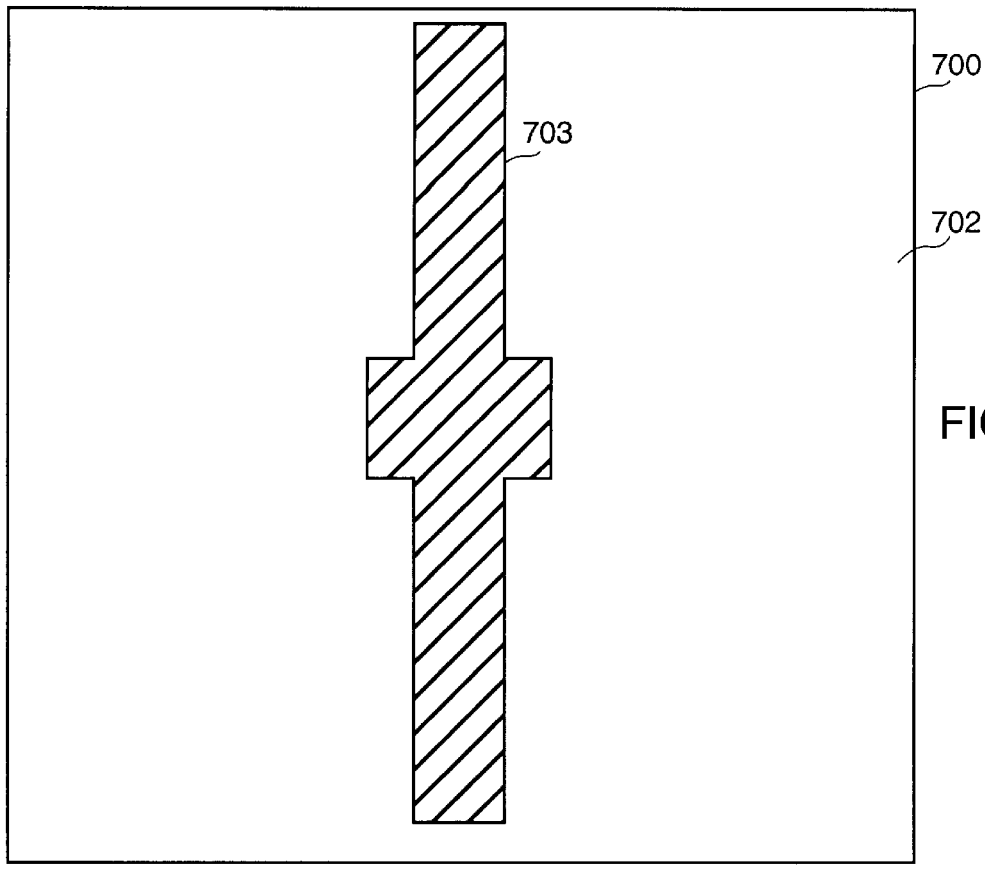
FIG. 9A shows, in accordance with one aspect of the present invention, a reticle design having transparent glass region and a chromium line design.
Figure 9B:
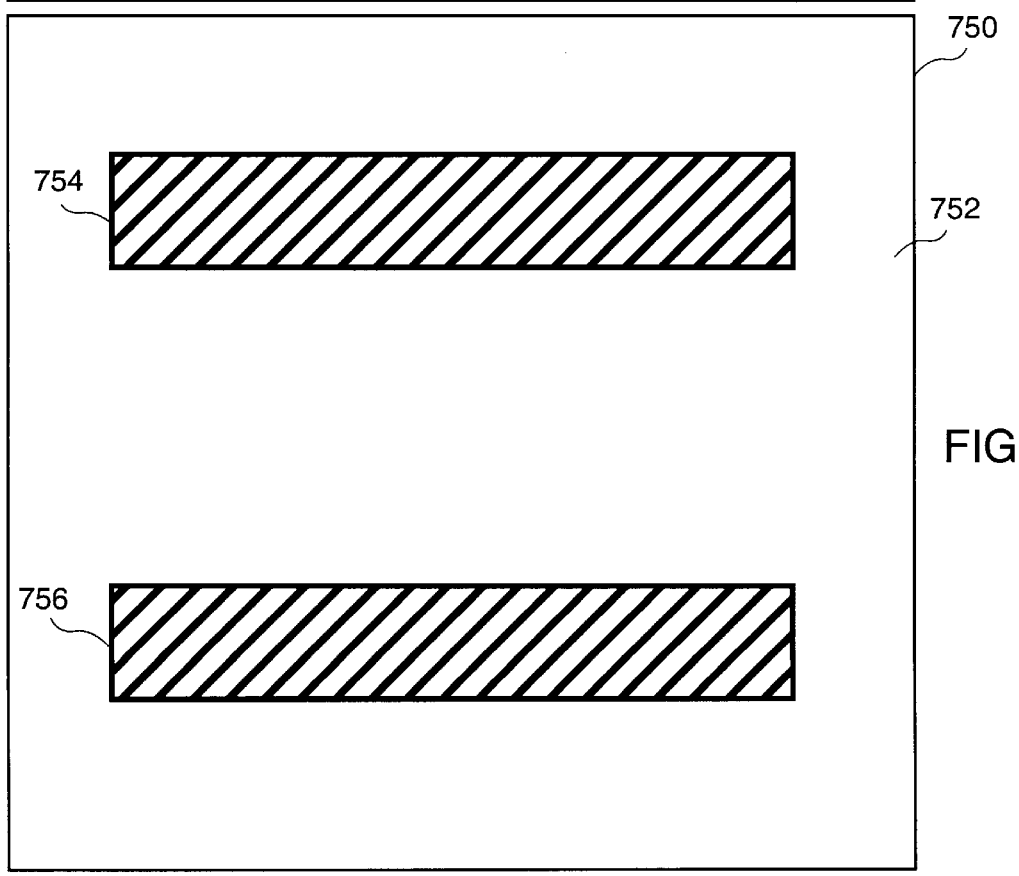
FIG. 9B illustrates, in one embodiment, a reticle design having a transparent glass region and a pair of chromium line designs.

FIGS. 9A and 9B present two hypothetical IC layout designs which are analyzed to identify locations where reflective notching should be provided. This information is used to modify the layout design of FIG. 9A so that the modified design can be transferred to a reticle. A layout design 700 to be modified includes a transparent background 702 and a dark line feature 903 (a polysilicon line for example). An image of feature 903 is to be projected onto a surface having topographical variations. Such topographical variations are introduced by processing the wafer surface at regions defined by a mask generated from a reticle design 750 shown in FIG. 9B. As shown, reticle design 750 includes a transparent background 752 and a pair of dark features 754 and 756. If reticle design 700 provides a polysilicon gate electrode pattern, reticle design 750 may define boundaries on a field oxide/active region pattern, with features 754 and 756 delineating the active regions.

The patterns provided for both IC layout designs are provided to DRC software as files containing properly formatted coordinates of the features in the layouts. The DRC software then compares the coordinate information contained in both files to ascertain where reticle mask edges intersect. As can be observed from the patterns on layout designs 700 and 750, the line feature 903 should intersect the active region features 754 and 756 at four locations. It should be understood that in actual IC designs, very many more such intersections are identified by the DRC. It should also be understood that topographical variations may occur between IC layers other than the illustrated field oxide layer. For example, topographical variations may also occur on pattern metallization layers, as set forth below.

The reticle design system modifies the first layout design as follows. The intersections provided by the DRC software are located on the first layout design. Then the design system applies the appropriate correction at those intersections. In a preferred embodiment, the correction takes the form of a rectangular segment having prespecified dimensions. For example, the system may apply a rectangle of about 0.20 μm by 0.60 μm at every intersection location. Of course, the actual size of a particular corrective segment is determined by the particular lithographic process used and through a combination of empirical data derived by conducting actual experiments and simulations.

The system employed to make the corrections may be part of a flexible system that performs various types of OPC or it may be a one-function system designed to perform reflective notching corrections only. Regardless of which type of system is employed, it may be integrated with the DRC in the manner described in the preceding section.

Figure 9C:
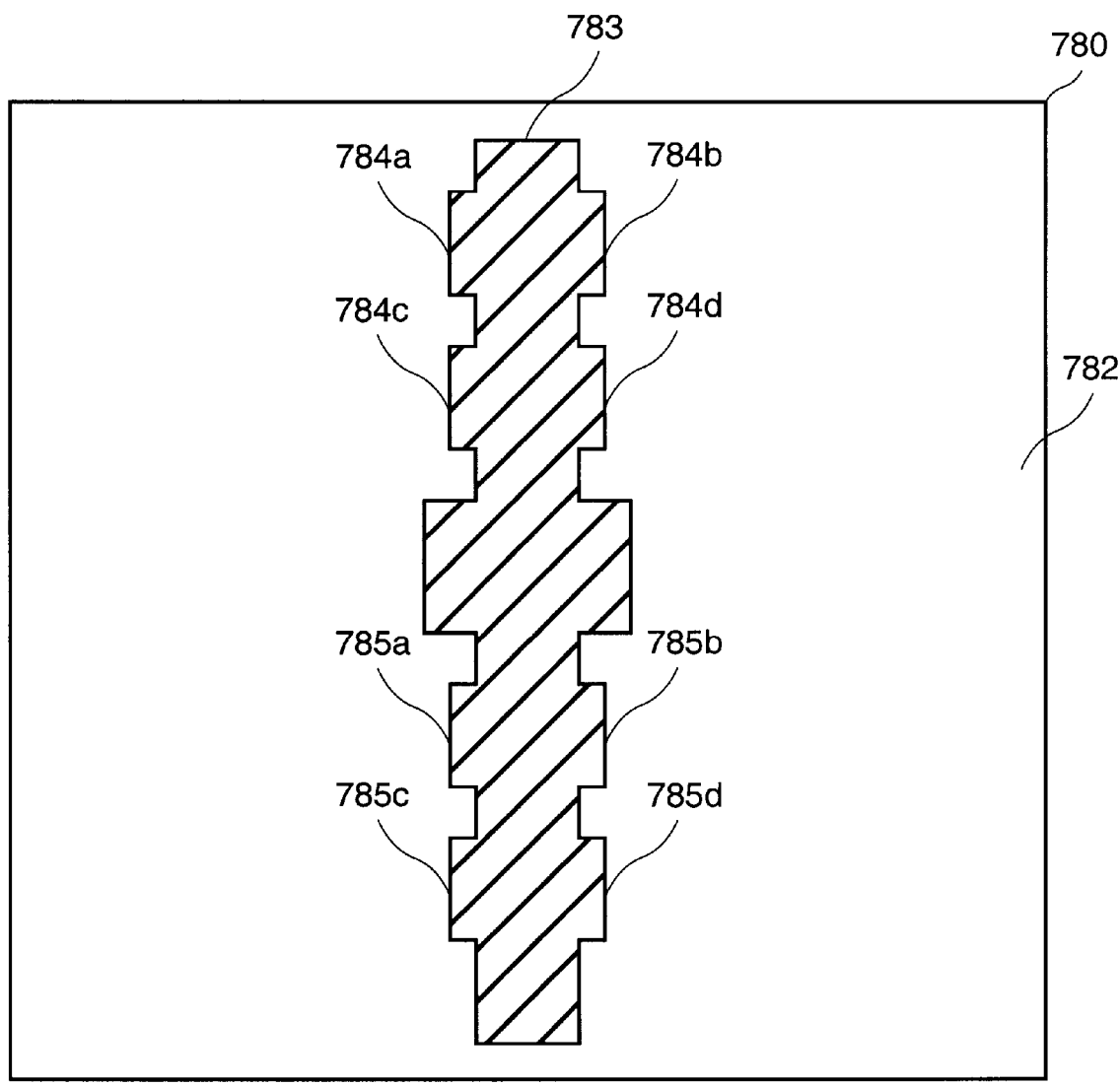
FIG. 9C show a corrected polysilicon layer reticle design having a transparent glass area and a chromium line design.

FIG. 9C show a corrected polysilicon layer reticle design 780 having a transparent glass area 782 and a chromium line pattern 783. Corrective segments 784a–784d have been added to compensate anticipated reflective notching 210a–210d (of FIG. 2A) which results when polysilicon line 208 passes over a topographical varying region (e.g., a high-low-high region). Similarly, corrective segments 785a–785d were added to compensate for anticipated reflective notching 211a–211d of FIG. 2A.

After the reflective notching corrections have been made, other appropriate optical proximity corrections may be made if appropriate. When all such corrections have been made, the IC layout design has been converted to a reticle design which can be converted to a physical reticle by a process such as MEBS mentioned above.

Figure 10:
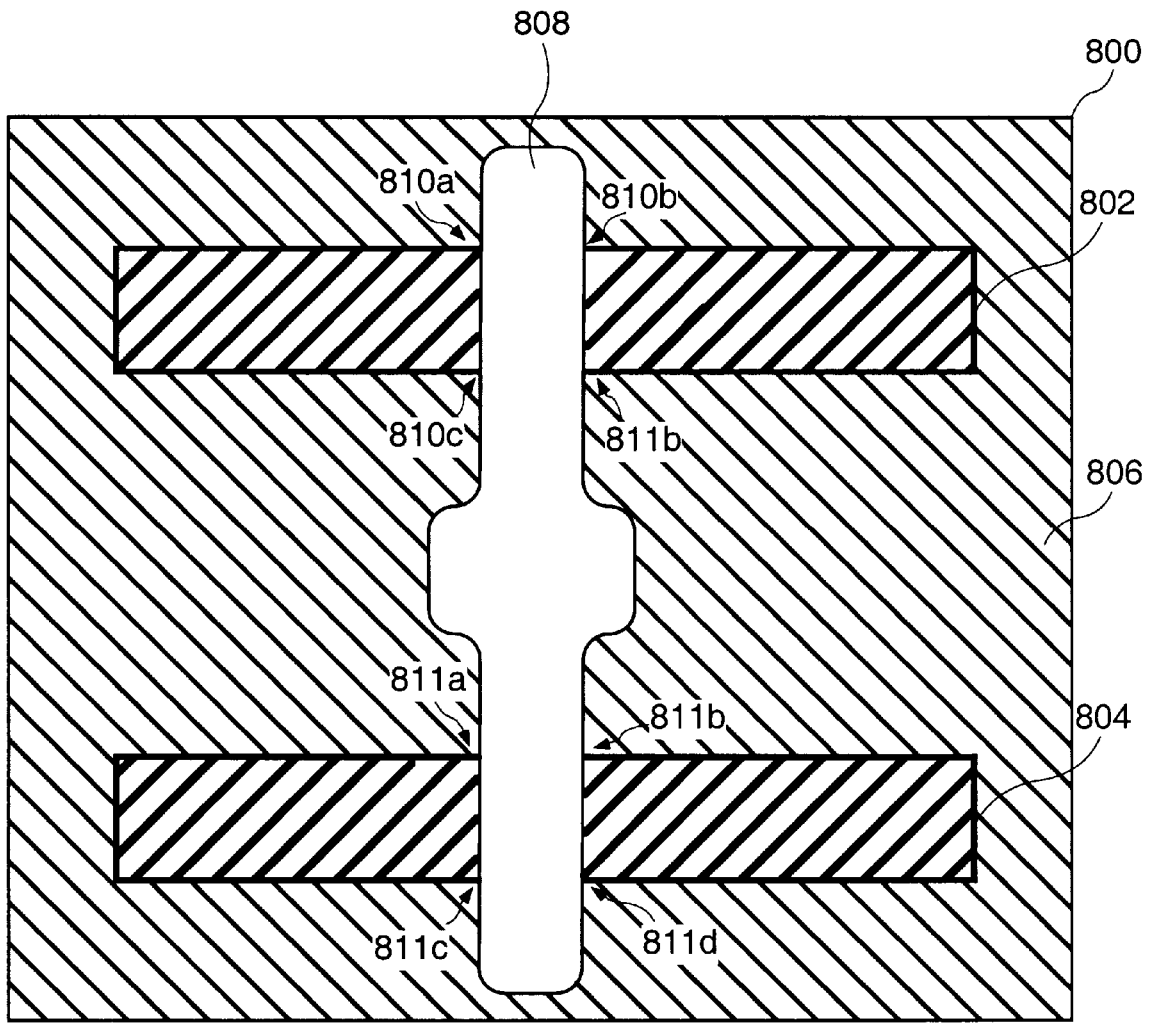
FIG. 10 shows an IC substrate having a polysilicon line (without a notching effect) passing over a high field oxide region and low diffusion regions.

Light projected through reticle 780 onto a wafer surface 800 having the field oxide pattern show in FIG. 9B should produce the image shown in FIG. 10. Note that a polysilicon line image 808 exhibits no reflective notching (compare FIG. 2A), even though line image 808 spans active regions 802 and 804 which are surrounded by a field oxide region 806. Thus, while the topographical variations are not eliminated from the surface of IC substrate 800, the reflective notching problem is no longer present. Note that reflective notching would normally be expected in regions 810a–810d and 811a–811d.

Figure 11:
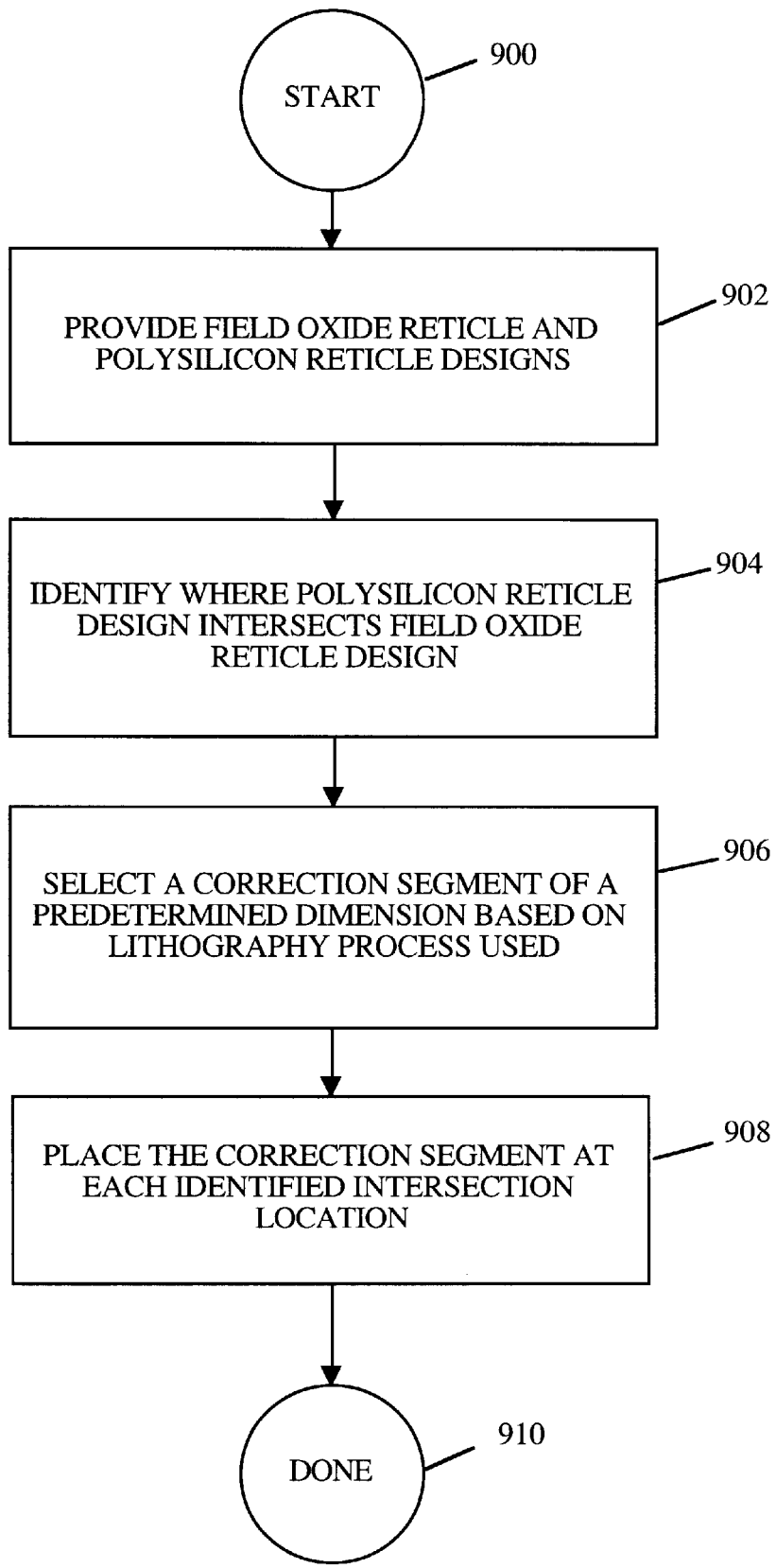
FIG. 11 is a process flow diagram illustrating the steps involved in performing optical proximity correction at topographically varying wafer surfaces.

The above described process of correcting reticle designs to compensate for reflective notching may be further understood with reference to a flow chart presented in FIG. 11. The process begins at 900, and then at a step 902 a field oxide reticle (e.g., reticle 750 of FIG. 9B) and a polysilicon reticle (e.g., reticle 700 of FIG. 9A) are provided. From step 902, the method proceeds to a step 904 where the locations of intersection between the polysilicon pattern edges and the field oxide pattern edges intersect. As mentioned above, in this embodiment, intersection locations are ascertained by implementing a design rule checker (DRC).

From step 904, the method proceeds to a step 906 where a correction segment is selected based on the particular lithographic process used. As mentioned above, the correction generally involves increasing line widths at the locations identified in step 904. However, such corrections may take on other forms as necessary. Generally, to eliminate a notch, the a counter notch should be made in the reticle. Such counter notch should be designed to allow more radiation—beyond that provided by the original layout design—to pass through. Its shape may be rectangular, triangular, semicircular, semielliptical, etc.

The selection referenced in step 906 may simply involve accepting a single type of segment that is to be used in any correction. Alternatively, it may involve a more significant decision between a group of available corrections. For example, differently sized and/or shaped rectangular correction segments may be chosen depending upon certain criteria associated with the location of the problem. Such criteria, might include the line width of the feature requiring correction or the size of the vertical topographical variation on the wafer surface. In some embodiments, the system may actually calculate the degree of correction required for each notch location.

From step 906, the method proceeds to a step 908 where the correction segment(s) selected in step 906 is placed at each intersection identified at step 904. In a preferred embodiment, the correction segments are centered on the intersections identified in step 904. From step 908, the method is completed at 910. As noted, the corrected reticle design may be subjected to further optical proximity correction. The final design is ultimately transferred to a hard reticle.

4. Method and Apparatus for Reducing Electromilration in the Metal Lines by Correcting for Depth of Focus Related Problems A method and apparatus are also provided which mitigate depth of focus induced problems of a projected reticle image onto the metal surface of a wafer. Briefly, referring back to FIGS. 3 and 4 and the associated discussion, narrowed regions 248, 248' of defined metal line features 247, 247' of the metallization layer 239 often result when the reticle image is projected onto elevated portions 240–244 of the metal surface 231. This elevated topographic variations result from the underlying geometry which position the elevated portions sufficiently above the plane of focus 245 of the reticule image to cause depth of focus effects. Hence, these "de-focused" portions of the reticle image result in adverse narrowed regions 248, 248' of the defined line features 247, 247'. Electromigration problems may therefore develop at these narrowed junctures due to "current crowding".

Initially, the present invention identifies where depth of focus effects on the reticle image are expected or likely to occur due to the anticipated elevated portions 240–244 of the metal surface 231 of the wafer 232. Subsequently, the line widths of the defined metal line features at these locations are increased by a predetermined amount to mitigate the adverse line narrowing which in turn reduces electromigration.

More specifically, a converting apparatus is provided for converting a layout design for a metallization layer integrated circuit pattern to a reticle design having corrections for depth of focus problems. A design rule checker, such as those above-discussed, identifies locations of the layout design which are expected to produce the narrowed regions 248, 248' of the image caused by depth of focus variations at the vertical projected intersections between defined line features of the layout design and the elevated portions of the topographical variations. A depth of focus correction unit modifies the layout design for the metallization integrated circuit pattern at the locations by increasing the line width of the defined line features from the integrated circuit pattern to correct for these depth of focus problems.

It will be appreciated that any underlying geometry which causes predictable elevated topographic variations of the overlying metal surface beyond a predetermined height (i.e., sufficiently above the plane of focus so as to cause depth of focus effects) may be a candidate for these depth of focus corrections. Preferably, this height differential is in the range of about 0.005 $\mu$m to about 0.100 $\mu$m, and more preferably about 0.030 $\mu$m. The underlying geometry, however, which is primarily the cause of depth of focus thinning effects on the defined metal line features include polysilicon gate geometry's 233, 234 and field oxide features 235 on a field oxide integrated circuit pattern.

Figure 14:
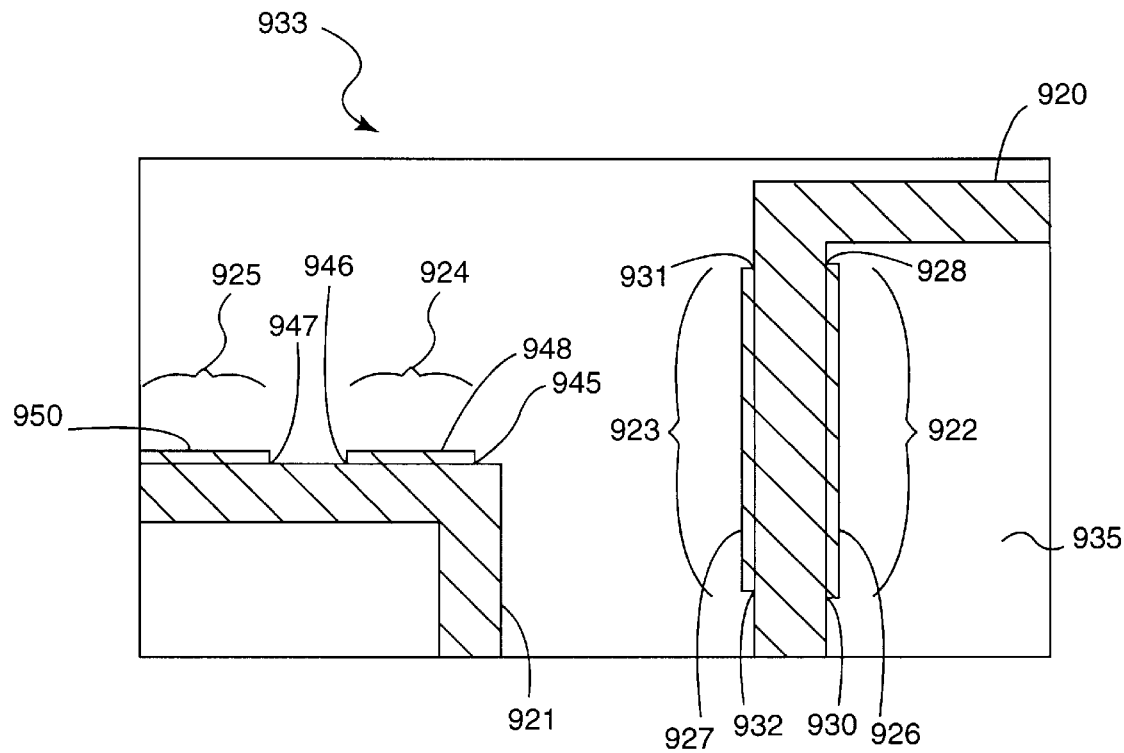
FIG. 14 shows a corrected segment of a metallization layer reticle design having a transparent glass area and a chromium line design.
Figure 15:
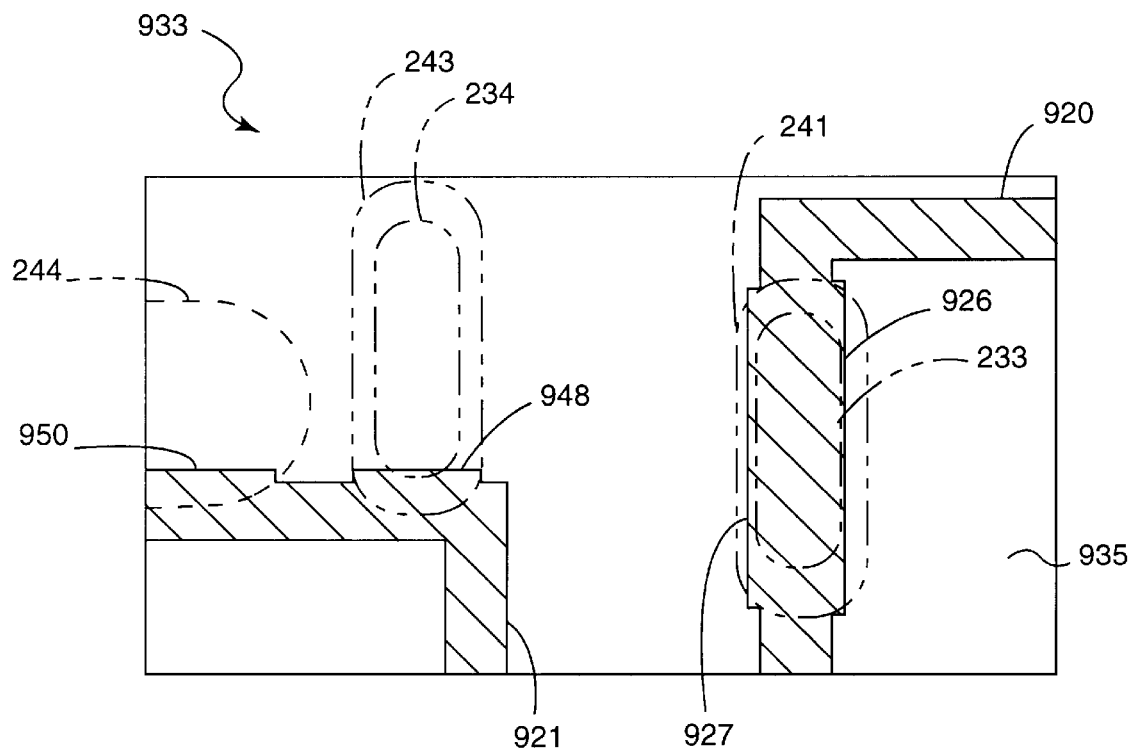
FIG. 15 shows the corrected segment of FIG. 14 transposed with the anticipated elevated portions corresponding to the underlying polysilicon gates.

Accordingly, turning now to FIGS. 14 and 15, the defined line features 920, 921 of the reticle image at these determined locations 922–925 may be increased in width to compensate for such narrowing effects. For instance, the locations 922, 923 associated with defined line feature 920 of a positive resist in a metallization layer may be increased in width at the projected intersection with the elevated region 241 of the metal surface 231 which is caused by the underlying polysilicon gate geometry 233. In preferred embodiment, the increased line width is provided by placing rectangular-shaped segments 926, 927 of a defined size or constant specified width dimensions generally centered on the midpoint of the intersections 928, 930 and 931, 932, respectively, between the defined edges of the defined line feature 920 with the elevated portion 241. The end portions of the rectangular segments 926, 927 may be positioned proximate the anticipated intersecting lines 928, 930 and 931, 932, or sufficiently beyond the intersecting lines.

As above-indicated, the depth of focus correction method and apparatus preferably employs design rule checker (DRC) software to identify the projected vertical intersections between the projected defined line features of the layout design of the reticle and the predicted elevated portions 240–244 of the metal surface 231 which are expected to surpass the predetermined height difference requirement. The DRC software may be used to identify many specific feature characteristics such as the polysilicon gates and the field oxide features of the field oxide integrated circuit pattern. As applied to depth of focus correction, the DRC might evaluate IC layout designs for a field oxide mask, a gate electrode mask and a metallization layer mask. By analyzing the three layout designs, or combination thererof, the DRC can quickly identify all locations where the defined metal line features intersect the expected elevated portions of the field oxides and the gate electrodes. Once such intersections are ascertained, other software procedures correct the metallization reticle design at the ascertained reticle locations in order to increase the line widths thereof to mitigate the anticipated depth of focus effects.

Figure 13:
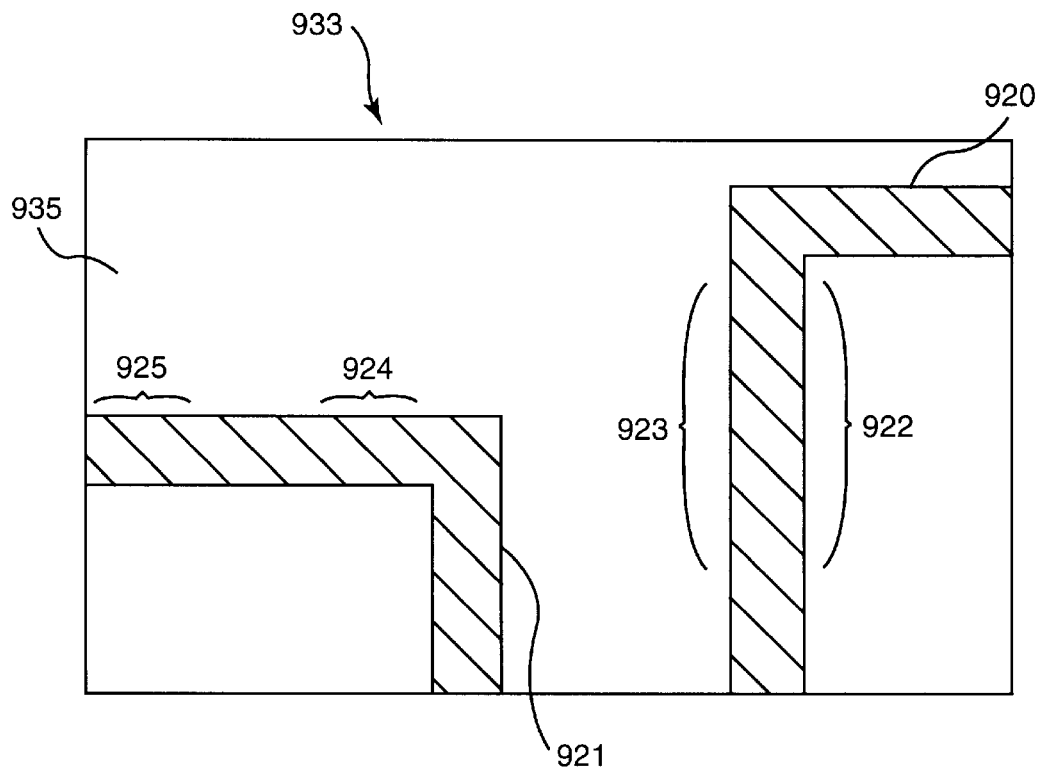
FIG. 13 illustrates a segment of a reticle design having a transparent glass region and a pair of chromium line designs for two metal lines.
Figure 12:
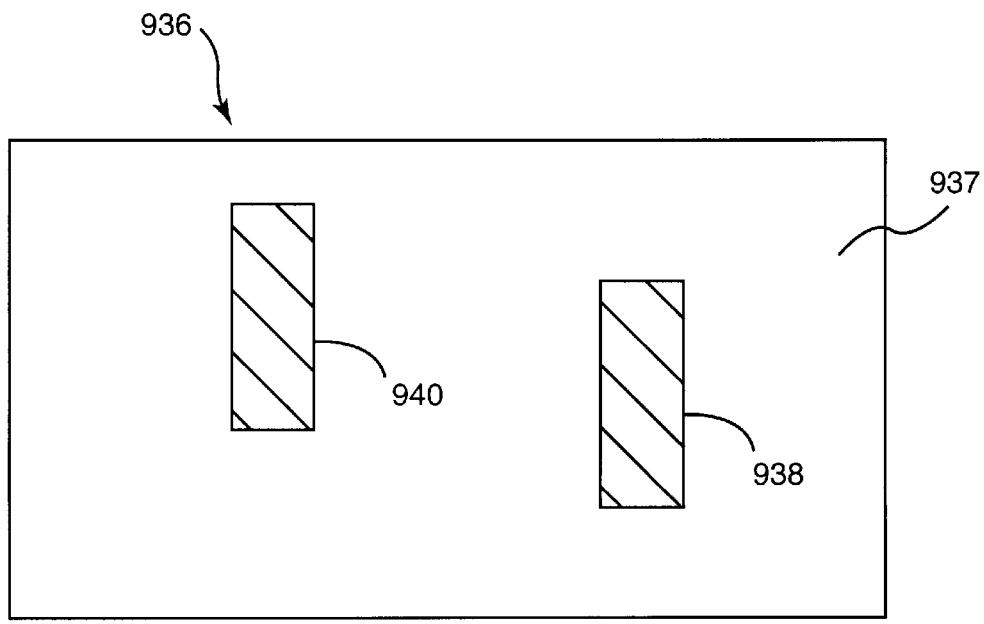
FIG. 12 shows a segment of a reticle design having transparent glass region and a chromium line design for polysilicon gate electrodes.

Referring back to FIGS. 12 and 13, two example IC layout designs are provided which are analyzed to identify locations where depth of focus corrections should be provided. This information is employed to modify the metallization layer layout design 933 of FIG. 13 so that the modified design can be transferred to a reticle. The metallization layer layout design 933 to be modified includes a transparent background 935 and dark line features 920, 921, (a defined metal line feature of metallization layer, for example). An image of metal line features 920, 921 are to be projected onto metal surface 231 having the elevated portions 240–244 of topographical variations of FIGS. 3 and 4, caused by the underlying geometry of at the gate level 249 the wafer. As indicated, such elevated portions are introduced by processing the gate electrodes 233, 234 (and/or the field oxide features 235) of the gate level at regions defined by a mask generated from the reticle layout design 936 of FIG. 12. This gate electrode layout design 936, for example, includes a transparent background 937 and a pair of dark features 938 and 940 representing the polysilicon gate electrodes. Another reticle design (not shown) may also define boundaries on a field oxide/active region pattern, with features delineating the active regions.

Figure 3:
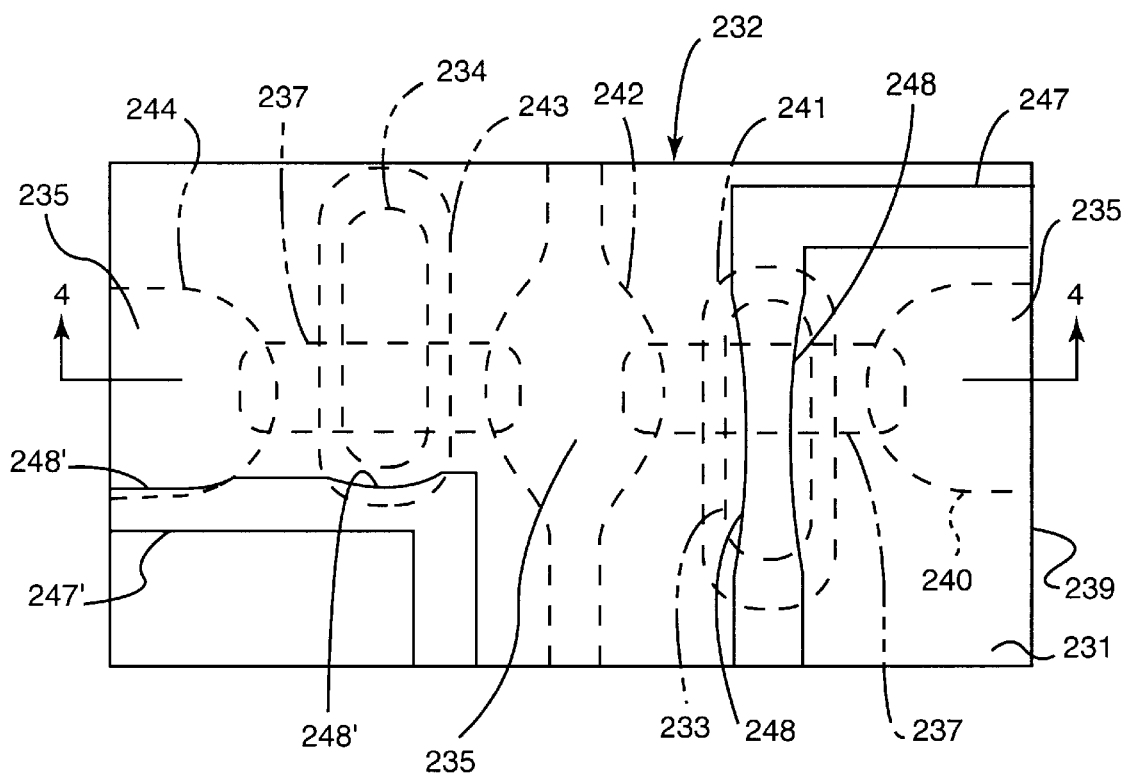
FIG. 3 is a top view of a semiconductor device having underlying field oxide features and a polysilicon gates, and a metal line showing unwanted depth of focus effects.
Figure 4:
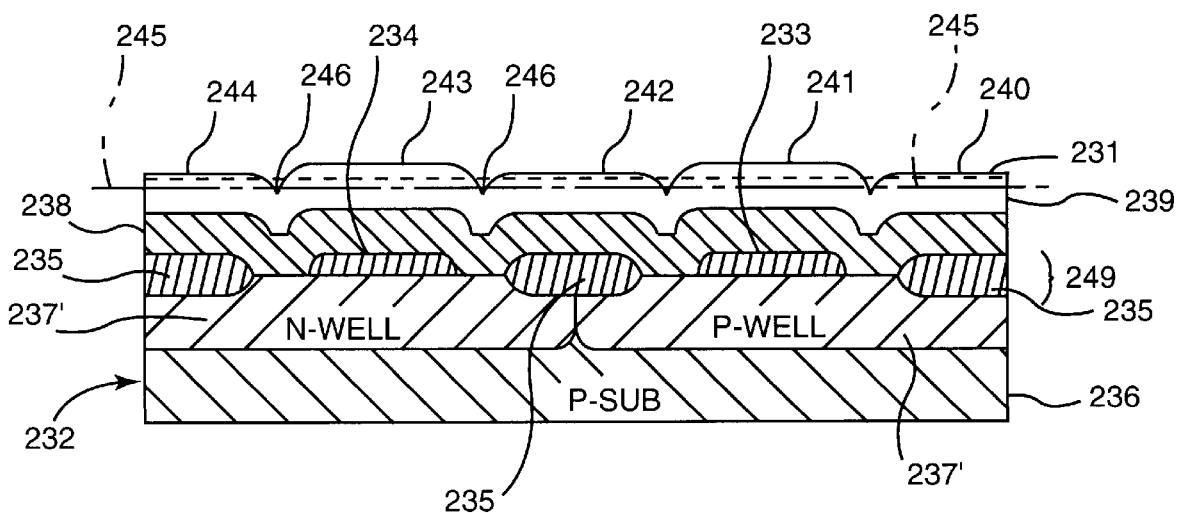
FIG. 4 is a cross sectional view of the semiconductor device taken substantially along the plane of the line 4—4 in FIG. 3, and illustrating a metal line image from the reticle.

The patterns for both IC layout designs are provided to DRC software as files containing properly formatted coordinates of the features in the layouts. In one aspect, the DRC software may analyze the gate electrode layout design 936, for example, and, based upon the gate electrode layout (FIG. 12), anticipate where elevated portions 241, 243 of metal surface 231 of the metallizaiton layer 239 is expected to surpass the predetermined height due to the formation of the underlying polysilicon gate electrode 233, 234 (FIGS. 3 and 4). Subsequently, the DRC software may then compare the coordinate information of the expected elevated portions 240–244 with the coordinate information of the metallization layer design layout (FIG. 13) to ascertain where the projected reticle mask edges intersect. As shown in FIG. 15, which illustrates an overlay of the metallization layer layout design 933, the gate electrode layout design 936, and the anticipated elevated portions 241, 243 and 244, the defined metal line feature 920 should intersect the anticipated elevated portion 241 at four intersections 928, 930 and 931, 932, while the defined metal line feature 921 should intersect the anticipated elevated portions 243 and 244 at three intersections 941, 942 and 943 shown. It should be appreciated, however, that in actual IC designs, substantially more such intersections are identified by the DRC.

To correct for the depth of focus effects, the reticle design system of the present invention modifies the metallization layer layout design 933 as follows. Once the intersections provided by the DRC software are located on the metallization layer layout design, the design system applies the appropriate correction at those intersections. In a preferred embodiment, the correction takes the form of uniformly increasing the line width between the intersections which infringe upon the anticipated elevated portion. Accordingly, in FIG. 15, the line width of the defined line feature 920 is uniformly increased between the intersections 928 and 930 on one side thereof, and uniformly increased between the intersections 931 and 932 on the opposite side thereof. For defined line feature 921, however, only one side infringes upon the anticipated elevated portion. Hence, only one side of the defined line is uniformly increased between the intersections 945 and 946, and at 947.

In the preferred form, the rectangular segments added to the line widths have a predetermined width increase in the range of about 0.05 $\mu$m to about 0.10 $\mu$m. Of course, the actual size of the width increase is determined by the particular lithographic process used and through a combination of empirical data derived by conducting actual experiments and simulations, as well as the length being determined by the anticipated length of the infringement upon the elevated portion.

Similar to the reflective notching corrective system above-mentioned, the system employed to make the depth of focus corrections may be part of a flexible system that performs various types of OPC or it may be a one-function system designed to perform depth of focus corrections only. Regardless of which type of system is employed, it may be integrated with the DRC in the manner described in the preceding section.

FIG. 14 illustrates a corrected metallization layer reticle layout design 933 having a transparent glass area 935 and chromium line patterns of defined lines 920, 921. Corrective segments 926, 927 have been added to metal line feature 920, and segments 948, 950 have been added to metal line feature 921 to compensate for the anticipated depth of focus effects of FIG. 3.

After the depth of focus corrections have been made, other appropriate optical proximity corrections such as the reflective notching correction, may be made if appropriate. When all such corrections have been made, the IC layout design has been converted to a reticle design which can be converted to a physical reticle by a process such as MEBS mentioned above.

Figure 16:
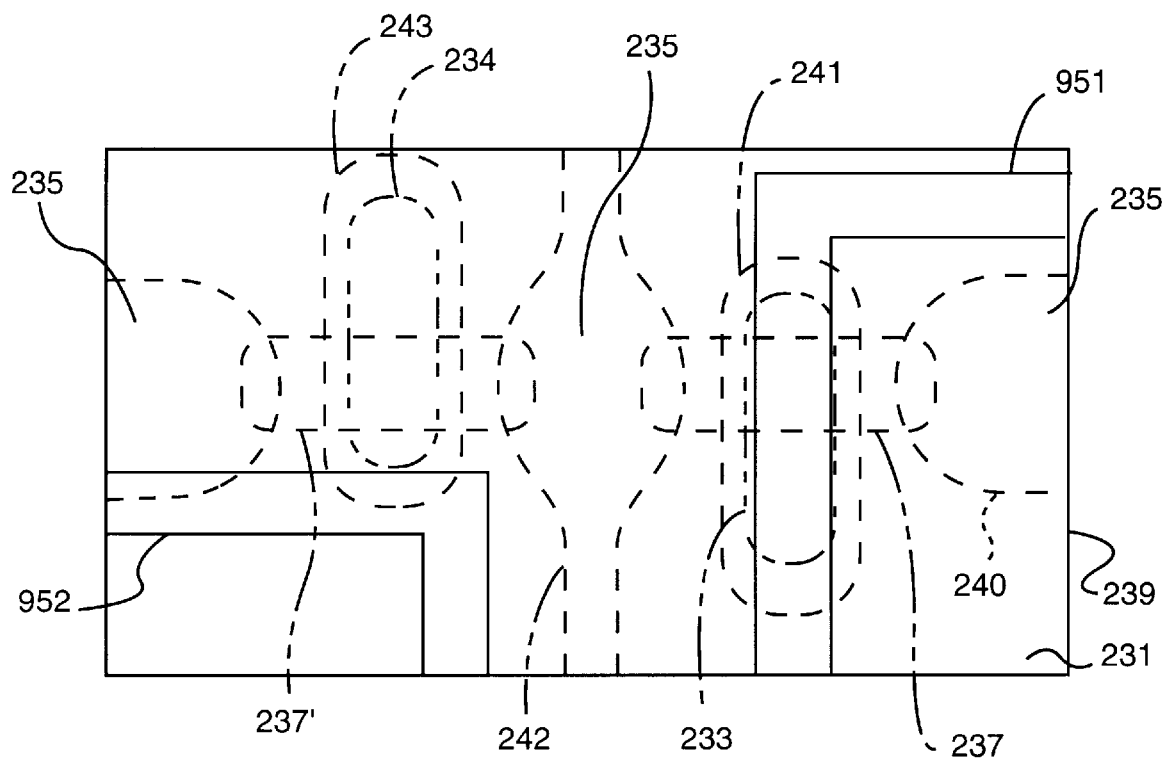
FIG. 16 is a corresponding segment of a wafer showing the metallization layer having metal lines corrected for depth of focus effects.

Light projected through metallization layer reticle layout design 933 (FIG. 14) onto a metal surface 231 of wafer 232, having elevated portions 240–244, should produce the metal line image shown in FIG. 16. Note that etched metal lines 951, 952 exhibit no depth of focus effects (compare FIG. 3), even though the metal lines 951, 952 span polysilicon gate electrodes 233, 234 and the field oxide features 235. Thus, while the elevated portions of the topographical variations are not eliminated from the metal surface of wafer 232, the depth of focus problem is no longer present.

Figure 17:
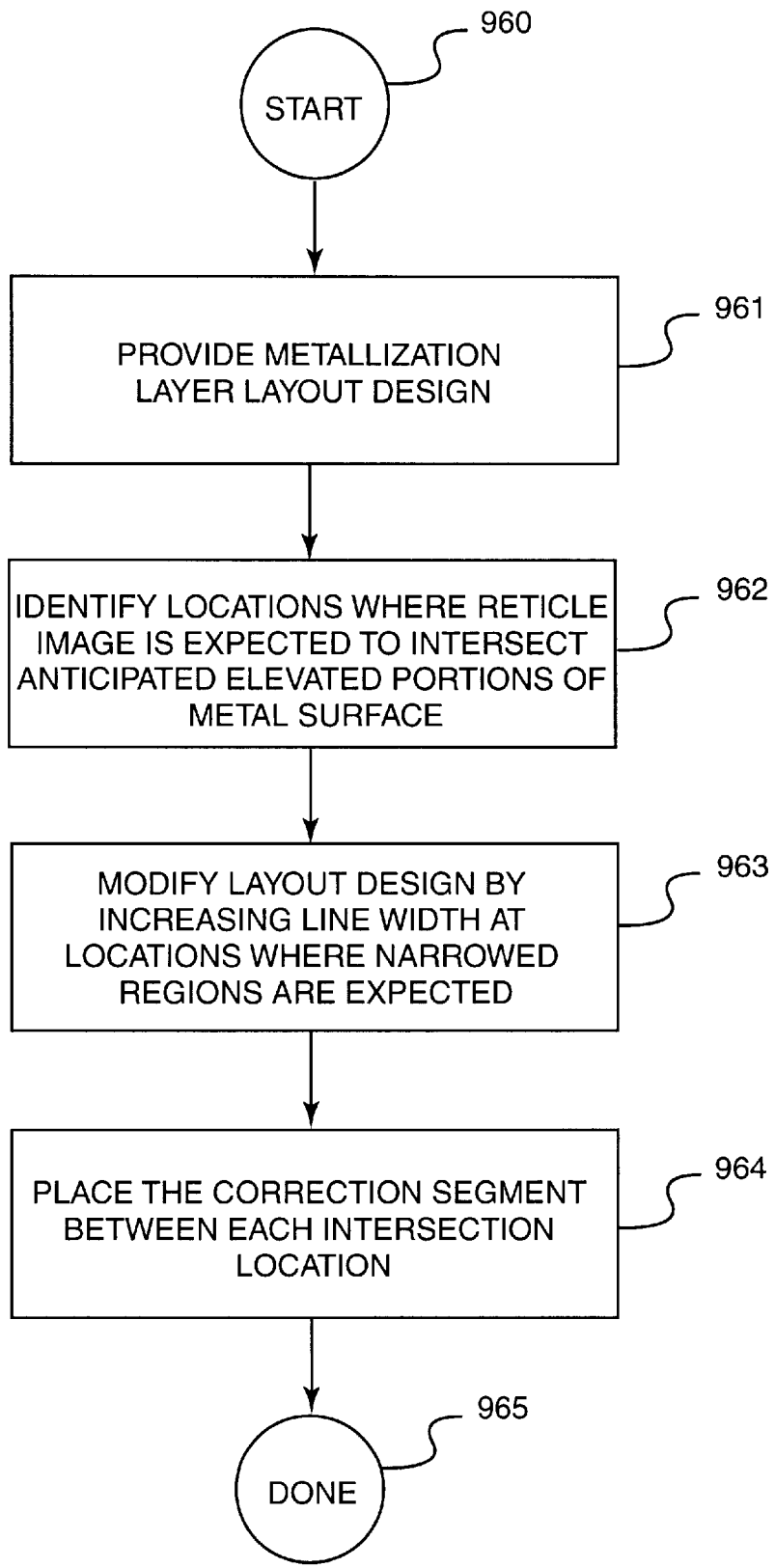
FIG. 17 is a process flow diagram illustrating the steps involved in performing depth of focus corrections at the elevated portions of topographically varying wafer surfaces.

From the above description of this embodiment of the present apparatus, it will be understood that a method of the present invention is provided for correcting reticule designs to compensate for depth of focus effects. Referring now to FIG. 17, a flow chart is presented which begins at 960. The first step 961 requires providing or obtaining a layout design 933 for the metallization layer integrated circuit pattern to be formed on the metal surface. As shown in FIG. 15, the pattern includes defined metal line features 920, 921. The next step 962 includes identifying locations on the metal surface 231 of the wafer which are expected to produce narrowed regions 248, 248' of the metal line image caused by depth of focus variations at their intersections with the elevated portions 240–244 of the topographical variations, such as those shown in FIG. 3. As mentioned above, in this embodiment, intersection locations are ascertained by implementing a design rule checker (DRC).

From step 962, the method of this embodiment proceeds to a step 963 for producing a reticle design by modifying the layout design for the metallization layer integrated circuit pattern such that the locations on the defined line features include line width increases from the integrated circuit pattern to correct for these depth of focus problems. This increase is performed by adding correction segments 926, 927 and 948, 950 (FIG. 15) which are selected based on the particular lithographic process used. As mentioned above, the correction generally involves increasing line widths at the locations identified in step 962. However, such corrections may take on other forms as necessary, such as rectangular, triangular, semicircular or semielliptical segments, etc.

The selection referenced in step 963 may simply involve accepting a single type of segment that is to be used in any correction. Alternatively, it may involve a more significant decision between a group of available corrections. For example, differently sized and/or shaped rectangular correction segments may be chosen depending upon certain criteria associated with the location of the problem. Such criteria, might include the line width of the feature requiring correction or the size of the vertical topographical variation on the wafer surface. In some embodiments, the system may actually calculate the degree of correction required for each location.

From step 963, the method proceeds to a step 964 where the correction segment(s) selected in step 963 is placed between the intersections 928, 930, for example, identified at step 962. In a preferred embodiment, the correction segments end at or extend just beyond the intersections identified in step 962. From step 964, the method is completed at 965. As noted, the corrected reticule design may be subjected to further optical proximity correction. The final design is ultimately transferred to a hard reticule.

Alternatively, the identifying the locations step 962 may be performed by determining where the underlying geometry of the gate level integrated circuit pattern intersects metal line features on the layout design for the metallization layer integrated circuit pattern or design layout.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A method of designing a reticle for producing an image of a metallization layer integrated circuit pattern when radiation is directed through the reticle and onto a resist coated metal surface of a wafer, the reticle being corrected for depth of focus problems caused by the projection of the image onto elevated portions of topographical variations of the metal surface caused by the underlying geometry, the method comprising the steps of:

(a) obtaining a layout design for the metallization layer integrated circuit pattern to be formed on the metal surface, the pattern having defined line features;

(b) on the defined line features, identifying locations which are expected to produce narrowed regions of the image caused by depth of focus variations at their intersections with the elevated portions of the topographical variations; and (c) producing a reticle design by modifying said layout design for the metallization layer integrated circuit pattern such that said locations on the defined line features include line width increases from the integrated circuit pattern to correct for these depth of focus problems.

2. The method of claim 1 wherein, the layout design for the integrated circuit pattern employed in step (a) has not been corrected for optical distortion.

3. The method of claim 1 wherein, the layout design for the integrated circuit pattern is provided as a digital representation.

4. The method of claim 3 wherein, the identifying step (b) is performed with the aid of design rule checking software.

5. The method of claim 4 wherein, the design rule checking software identifies said locations by determining where the underlying geometry of a gate level integrated circuit pattern intersects metal line features on said layout design for the metallization layer integrated circuit pattern.

6. The method of claim 5 wherein, the determining step is further performed by estimating where the expected elevated portions at the intersection the metal line features surpass a predetermined height.

7. The method of claim 6 wherein, said predetermined height is in the range of about 0.03 $\mu$m to about 0.10 $\mu$m.

8. The method of claim 6 wherein, said underlying geometry of the gate level includes the gate features on a gate integrated circuit pattern.

9. The method of claim 8 wherein, said underlying geometry of the gate level includes the field oxide features on a field oxide integrated circuit pattern.

10. The method of claim 6 wherein, underlying geometry of the gate level includes the gate geometry's.

11. The method of claim 1 wherein, the line widths are increased by adding rectangular regions of constant specified dimensions centered on said locations.

12. The method of claim 1 further comprising a step of:

converting said reticle design to a pattern on a reticle.

13. A reticle design having correction for depth of focus problems caused by the projection of an image of a metallization layer integrated circuit pattern onto elevated portions of topographical variations of a metal surface of a wafer which result from the underlying geometry, the reticle design comprising:

a layout design for the metallization layer integrated circuit pattern modified such that defined line feature locations on said layout design that intersect said elevated portions of the topographical variations contain increased line widths of the defined line feature from the integrated circuit pattern which reduce depth of focus problems in said image.

14. The reticle design according to claim 13 wherein, said increases in line widths include rectangular regions of constant specified dimensions centered on said locations.

15. The reticle design according to claim 13 wherein, said reticle design is provided on a reticle.

* * * * *